United States Patent
Mase et al.

(10) Patent No.: US 9,664,780 B2
(45) Date of Patent: May 30, 2017

(54) DISTANCE SENSOR AND DISTANCE IMAGE SENSOR

(71) Applicant: HAMAMATSU PHOTONICS K.K., Hamamatsu-shi, Shizuoka (JP)

(72) Inventors: Mitsuhito Mase, Hamamatsu (JP); Jun Hiramitsu, Hamamatsu (JP); Takashi Suzuki, Hamamatsu (JP)

(73) Assignee: HAMAMATSU PHOTONICS K.K., Hamamatsu-shi, Shizuoka (JP)

( * ) Notice: Subject to any disclaimer, the term of this patent is extended or adjusted under 35 U.S.C. 154(b) by 239 days.

(21) Appl. No.: 14/433,066

(22) PCT Filed: Jul. 5, 2013

(86) PCT No.: PCT/JP2013/068525
§ 371 (c)(1),
(2) Date: Apr. 2, 2015

(87) PCT Pub. No.: WO2014/064973
PCT Pub. Date: May 1, 2014

(65) Prior Publication Data
US 2015/0276922 A1    Oct. 1, 2015

(30) Foreign Application Priority Data
Oct. 26, 2012 (JP) .............................. 2012-236914

(51) Int. Cl.
*G01C 3/08* (2006.01)
*G01S 7/481* (2006.01)
(Continued)

(52) U.S. Cl.
CPC .......... *G01S 7/4816* (2013.01); *G01S 7/4863* (2013.01); *G01S 17/08* (2013.01); *G01S 17/89* (2013.01);
(Continued)

(58) Field of Classification Search
CPC ...... G01S 7/4816; G01S 7/4863; G01S 17/89; G01S 17/08; H01L 27/14605; H01L 27/14612; H01L 27/1461
(Continued)

(56) References Cited

U.S. PATENT DOCUMENTS

| | | | |
|---|---|---|---|
| 8,952,427 B2* | 2/2015 | Suzuki .................... | G01S 17/89 257/215 |
| 9,134,401 B2* | 9/2015 | Mase ...................... | G01S 17/10 |

(Continued)

FOREIGN PATENT DOCUMENTS

| | | |
|---|---|---|
| JP | 2010-040594 A | 2/2010 |
| JP | 2011-112376 | 6/2011 |

(Continued)

*Primary Examiner* — Mark Hellner
(74) *Attorney, Agent, or Firm* — Drinker Biddle & Reath LLP

(57) ABSTRACT

A distance sensor includes: a light receiving area including a first longer side and a second longer side; a photo gate electrode arranged on the light receiving area; a plurality of signal charge collection regions along the first longer side; a plurality of signal charge collection regions along the second longer side; a plurality of transfer electrodes along the first longer side provided with charge transfer signals having mutually-differing phases; a plurality of transfer electrodes along the second longer side provided with the charge transfer signals having mutually-differing phases; and a potential adjusting means positioned between the first and second longer sides and raises potential of an area extending in a direction in which the first and second longer sides extend to be higher than potential of side areas of the first and second longer sides.

10 Claims, 24 Drawing Sheets

(51) Int. Cl.
 *G01S 17/89* (2006.01)
 *H01L 27/146* (2006.01)
 *G01S 7/486* (2006.01)
 *G01S 17/08* (2006.01)

(52) U.S. Cl.
 CPC .... *H01L 27/1461* (2013.01); *H01L 27/14605* (2013.01); *H01L 27/14612* (2013.01)

(58) Field of Classification Search
 USPC ........................................................ 356/5.01
 See application file for complete search history.

(56) References Cited

U.S. PATENT DOCUMENTS

| | | | |
|---|---|---|---|
| 2009/0134396 A1* | 5/2009 | Kawahito | ............... G01S 17/10 257/72 |
| 2011/0188026 A1 | 8/2011 | Lee et al. | |
| 2011/0198481 A1 | 8/2011 | Kim et al. | |
| 2012/0205723 A1* | 8/2012 | Suzuki | .................... G01S 17/89 257/215 |
| 2016/0035781 A1* | 2/2016 | Sogoh | ............... H01L 27/14609 257/292 |

FOREIGN PATENT DOCUMENTS

| | | |
|---|---|---|
| JP | 2011-112385 A | 6/2011 |
| JP | 2012-083213 A | 4/2012 |
| JP | 2012-083220 A | 4/2012 |
| JP | 2012-083221 A | 4/2012 |

* cited by examiner

Fig.8
(a)
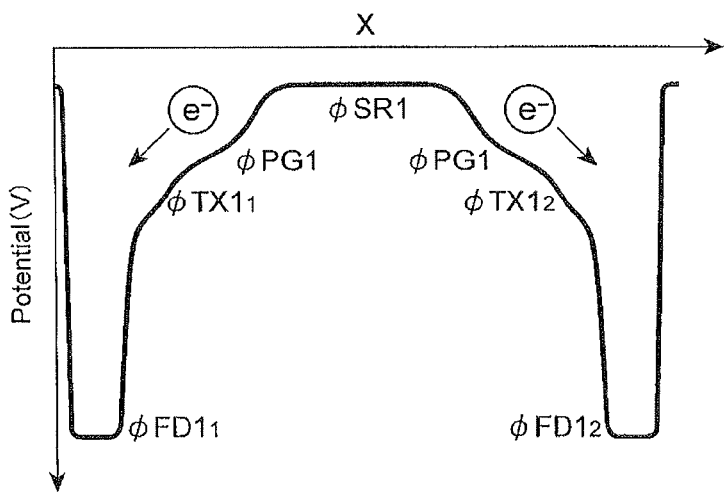
(b)
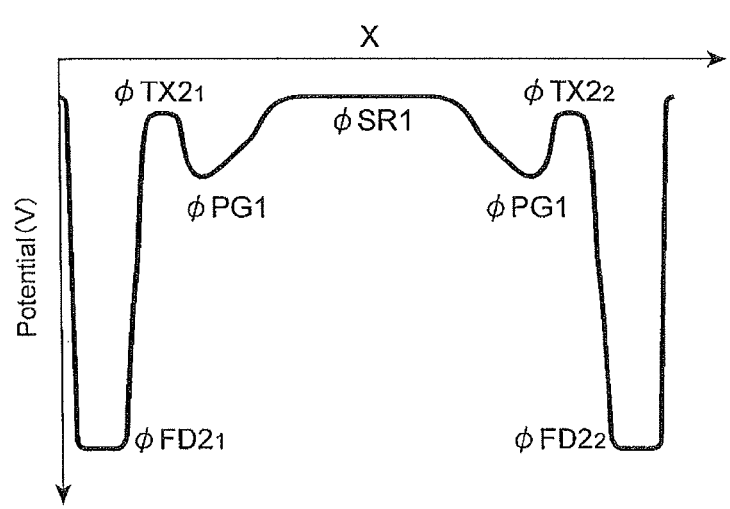
(c)
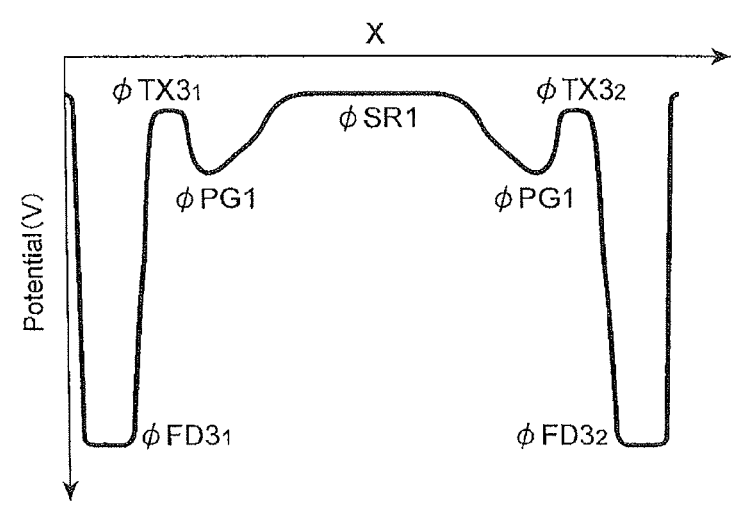

Fig.9
(a)
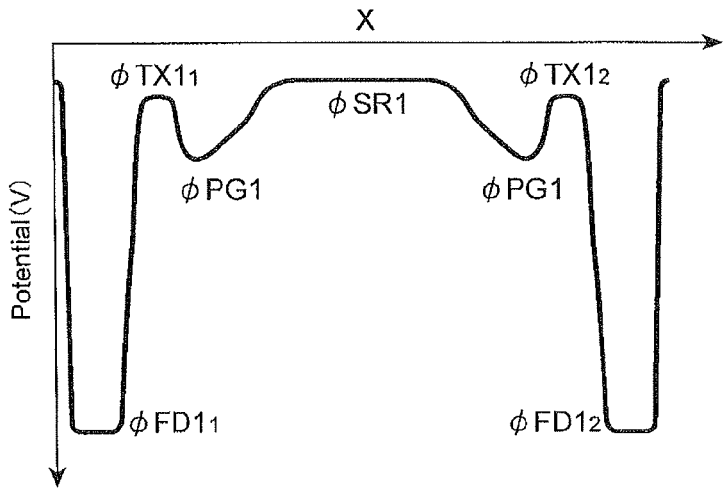
(b)
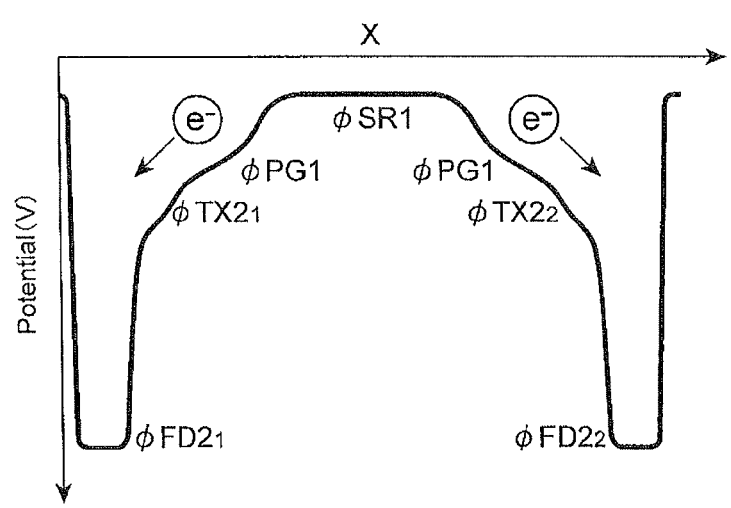
(c)
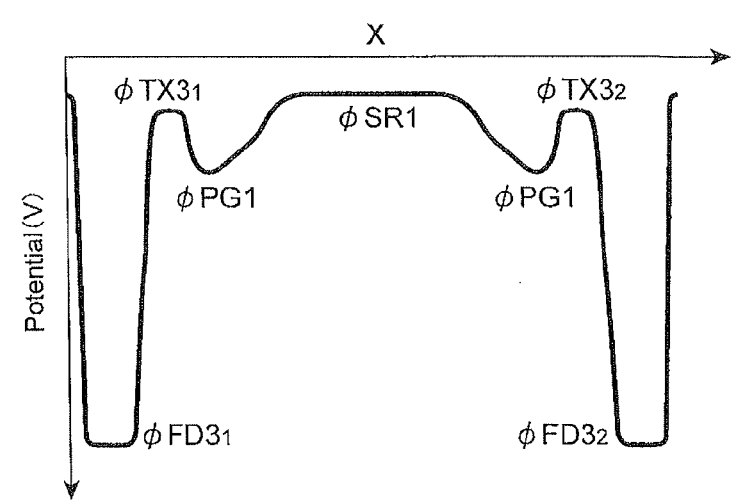

Fig.10
(a)
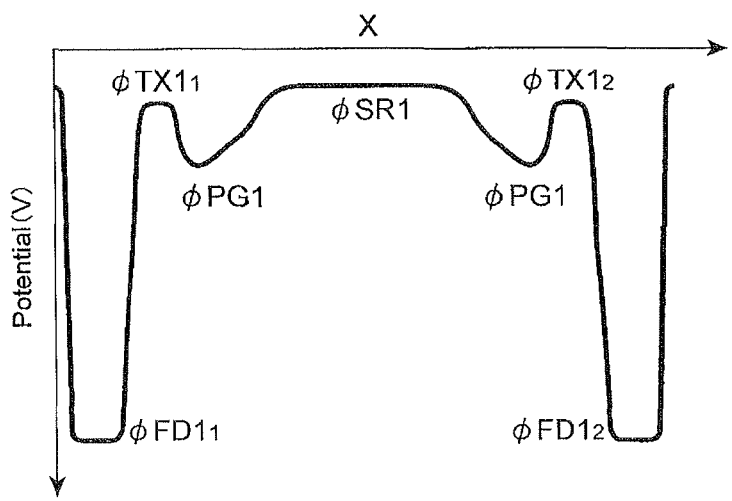
(b)
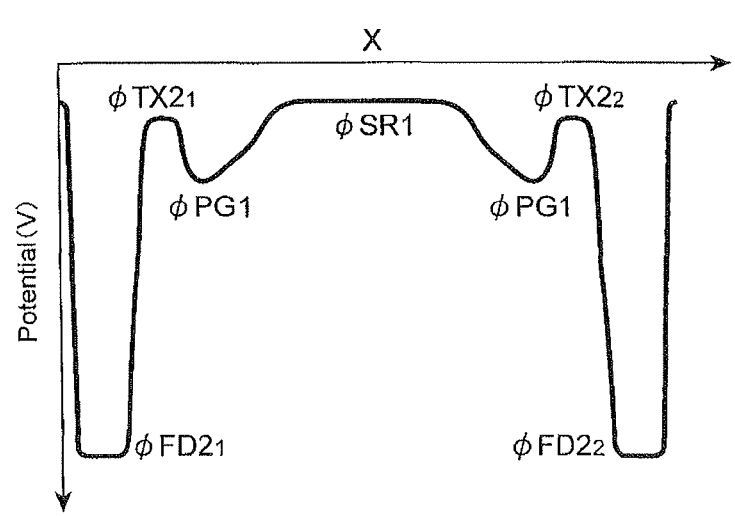
(c)
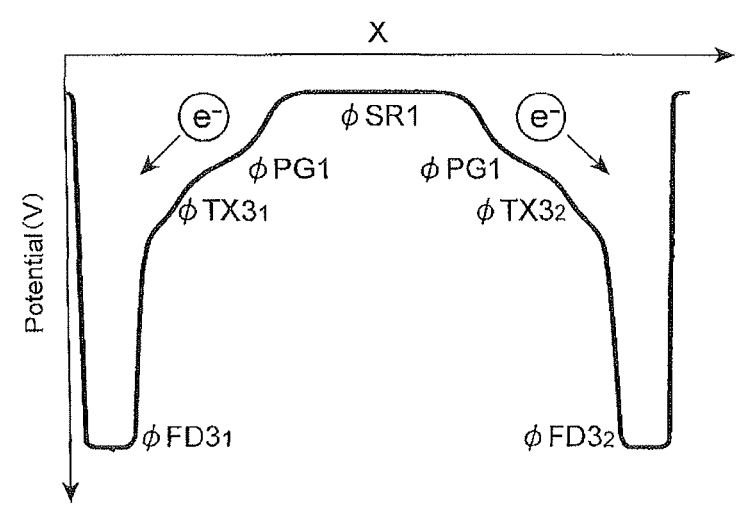

DISTANCE SENSOR AND DISTANCE IMAGE SENSOR

TECHNICAL FIELD

The present invention relates to a distance sensor and a distance image sensor.

BACKGROUND ART

TOF (Time-Of-Flight)-type distance image sensors (distance sensors) are known. For example, in Patent Literatures 1 and 2, technologies for improving the transfer speed of distance image sensors are disclosed. In the sensors described in Patent Literatures 1 and 2, one pair of transfer electrodes used for transferring electric charge generated in an electric charge generation region to an electric charge collection region are arranged along predetermined one side of the electric charge generation region having a rectangular shape. In the electric charge generation region, the impurity concentration increases toward the predetermined one side, and inclination in the potential distribution is formed toward the predetermined one side. Accordingly, electric charge generated in the electric charge generation region can easily move toward the transmission electrodes.

For example, in Patent Literature 3, for a distance image sensor, a technology for suppressing crosstalk between transfer electrodes to which signals of mutually-differing phases are input is disclosed. In a sensor disclosed in Patent Literature 3, the transfer electrodes to which signals of mutually-differing phases are input are arranged so as to face each other across an electric charge generation region. In the electric charge generation region, an impurity region that is an insulating area is disposed between the transfer electrodes. Accordingly, only electric charge generated in a portion disposed on one side of the impurity region in the electric charge generation region moves toward the transfer electrode of one side, and only electric charge generated in a portion disposed on the other side of the impurity region in the electric charge generation region moves toward the transfer electrode of the other side.

CITATION LIST

Patent Literature

Patent Literature 1: Japanese Patent Application Laid-Open Publication No. 2010-40594
Patent Literature 2: U.S. Patent Application Publication No 2011/0198481
Patent Literature 3: U.S. Patent Application Publication No. 2011/0188026

SUMMARY OF INVENTION

Technical Problem

An object of the present invention is to provide a distance sensor and a distance image sensor capable of achieving improvement of transfer speed, improvement of transfer precision, and improvement of an aperture ratio.

Solution to Problem

According to an aspect of the present invention, there is provided a distance sensor including: a light receiving area including a first side and a second side facing each other, a length of the first and second sides being longer than a gap between the first side and the second side; a photo gate electrode arranged along the first side and the second side on the light receiving area; a plurality of first-side signal charge collection regions arranged on a side of the first side of the light receiving area to be separate from each other along the first side and collecting signal charge generated according to incident light; a plurality of second-side signal charge collection regions arranged on a side of the second side of the light receiving area to be separate from each other along the second side, each of the plurality of second-side signal charge collection regions being arranged to face the corresponding first-side signal charge collection region across the light receiving area, and collecting the signal charge; a plurality of first-side transfer electrodes provided with charge transfer signals having mutually-differing phases, and arranged between the corresponding first-side signal charge collection regions and the photo gate electrode; a plurality of second-side transfer electrodes provided with the charge transfer signals having mutually-differing phases, and arranged between the corresponding second-side signal charge collection regions and the photo gate electrode; and a potential adjusting means positioned between the first side and the second side and raising potential of an area extending in a direction in which the first and second sides extend to be higher than potential of an area disposed further on the side of the first side and an area disposed further on the side of the second side than the area such that inclination of the potential is formed from the area toward the side of the first side and the side of the second side.

In the distance sensor of the present invention, high potential is generated in the area positioned between the first side and the second side of the light receiving area, and inclination of the potential is formed from the area toward the first side and the second side. Accordingly, among signal charges generated according to the incident light, signal charge generated in the area right below a portion of the photo gate electrode that is disposed on the side of the first side is accelerated toward the first side, and signal charges generated in the area right below the portion of the photo gate electrode that is disposed on the side of the second side is accelerated toward the second side. Thus, the transfer speed can be improved.

In addition, high potential is generated between the first side and the second side, and inclination of the potential is formed toward both the first side and the second side. For example, the moving distance of the signal charge is shorter than that of a case where the transfer electrodes are arranged along only one of the first and second sides, and inclination of the potential is formed from the other of the first and second sides toward the one thereof. Accordingly, the transfer speed can be improved.

Since the potential adjusting means is shared by the area right below the portion of the photo gate electrode that is disposed on the side of the first side and the area right below the portion of the photo gate electrode that is disposed on the side of the second side, the use efficiency of the area is improved. Accordingly, the aperture ratio can be improved.

The charge transfer signals having mutually-differing phases are input to a plurality of first-side transfer electrodes, and the charge transfer signals having the mutually-differing phases are also input to a plurality of second-side transfer electrodes. Thus, even when any one charge transfer signal is given, the signal charges generated in both the area right below the portion of the photo gate electrode on the side of the first side and the area right below the portion of the photo gate electrode on the side of the second side can be acquired. Accordingly, a failure in collection of the signal charge decreases, and the transfer precision can be improved.

Since the charge transfer signals having mutually-differing phases are input to a plurality of first-side transfer electrodes, and the charge transfer signals having the mutually-differing phases are also input to a plurality of second-side transfer electrodes, the influence of manufacturing variations in the direction in which the first side and the second side face each other can be much reduced compared with that of a case where only charge transfer signals having one phase are input to each of the first-side transfer electrode and the second-side transfer electrode. Accordingly, the transfer precision can be improved.

The plurality of first-side transfer electrodes and the plurality of second-side transfer electrodes may be arranged such that the first-side transfer electrode and the second-side transfer electrode, provided with the charge transfer signals having the same phase, face each other in a direction in which the first side and the second side face each other.

The plurality of first-side transfer electrodes and the plurality of second-side transfer electrodes may be arranged such that the first-side transfer electrode and the second-side transfer electrode, provided with the charge transfer signals having mutually-differing phases, face each other in a direction in which the first side and the second side face each other. In such a case, since the input positions of the charge transfer signals having the same phase are different between the side of the first side and the side of the second side, the dependence on the input positions of the charge transfer signals can be offset. Accordingly, the transfer precision can be improved.

The plurality of first-side transfer electrodes and the plurality of second-side transfer electrodes may be arranged at positions deviating from each other in the direction in which the first and second sides extend. In such a case, since the input positions of the charge transfer signals having the same phase are different between the side of the first side and the side of the second side, the dependence on the input positions of the charge transfer signals can be offset. Accordingly, the transfer precision can be improved.

The plurality of first-side transfer electrodes may include a pair of the first-side transfer electrodes provided with the charge transfer signals having mutually-differing phases, and adjacent to each other in the direction in which the first and second sides extend, the plurality of second-side transfer electrodes may include a pair of the second-side transfer electrodes provided with the charge transfer signals having mutually-differing phases, and adjacent to each other in the direction in which the first and second sides extend, and each of the first-side transfer electrodes of the pair and each of the second-side transfer electrodes of the pair may include a first portion extending in the direction in which the first and second sides extend, and a second portion extending to overlap the light receiving area from an end portion of the first portion positioned farther from the adjacent first portion. In such a case, when signal charge is transferred, in an area right below the transfer electrode that does not transfer the signal charge out of the pair of transfer electrodes, the potential can be raised. Thus, in the light receiving area, inclination of the potential from the second portion of the transfer electrode, which does not transfer signal charge, along the direction in which the first and second sides extend occurs, and the signal charge quickly moves in the direction in which the first and second sides extend. Accordingly, the transfer speed can be improved.

The distance sensor may further include: first-side unnecessary electric charge discharging regions arranged on the side of the first side of the light receiving area to be separate from each other along the first side and separate from the first-side signal charge collection regions, and discharging generated unnecessary electric charge; second-side unnecessary electric charge discharging regions arranged on the side of the second side of the light receiving area to be separate from each other along the second side and separate from the second-side signal charge collection regions, and discharging generated unnecessary electric charge; first-side unnecessary electric charge discharging gate electrodes arranged between the first-side unnecessary electric charge discharging regions and the photo gate electrode, and selectively performing blocking and releasing of a flow of unnecessary electric charge to the first-side unnecessary electric charge discharging regions; and second-side unnecessary electric charge discharging gate electrodes arranged between the second-side unnecessary electric charge discharging regions and the photo gate electrode, and selectively performing blocking and releasing of a flow of unnecessary electric charge to the second-side unnecessary electric charge discharging regions. In such a case, since unnecessary electric charge can be discharged, the transfer precision can be improved.

Each of the first-side unnecessary electric charge discharging gate electrodes and the second-side unnecessary electric charge discharging gate electrodes may include a third portion extending in the direction in which the first and second sides extend, and a fourth portion extending from the third portion to overlap the light receiving area. In such a case, when signal charge is transferred, in an area right below the unnecessary electric charge discharging gate, the potential can be raised. Accordingly, in the light receiving area, inclination of the potential occurs along the direction in which the first and second sides extend from the fourth portions of the unnecessary electric charge discharging gates toward the periphery thereof, and the signal charges quickly move in the direction in which the first and second sides extend. Accordingly, the transfer speed can be improved.

The light receiving area may include a first area including the first side and extending in a direction in which the first side extends, and a second area including the second side and extending in a direction in which the second side extends, and the potential adjusting means may be a semiconductor region arranged to be positioned between the first area and the second area, has the same conductivity type as a conductivity type of the first and second areas, and has higher impurity concentration than those of the first and second areas. In such a case, high potential can be generated using a simple configuration.

The photo gate electrode may include a first electrode part arranged on a side area of the first side of the light receiving area, and a second electrode part separate from the first electrode part in a direction in which the first side and the second side face each other and arranged on a side area of the second side of the light receiving area, and the potential adjusting means may be an electrode arranged between the first electrode part and the second electrode part to be electrically separated from the first and second electrode parts, and is supplied with electric potential lower than electric potential applied to the photo gate electrode. In such a case, the degree of inclination of the potential can be appropriately adjusted.

According to another aspect of the present invention, there is provided a distance image sensor including an imaging area configured by a plurality of units arranged in a one-dimensional pattern or a two-dimensional pattern on a semiconductor substrate and acquiring a distance image based on amounts of electric charges output from the units, each of the units being the distance sensor according to any one of the distance sensors described above.

According to the present invention, as described above, improvement of the transfer speed, improvement of the transfer precision, and improvement of the aperture ratio can be achieved.

Advantageous Effects of Invention

According to the present invention, it is possible to provide a distance sensor and a distance image sensor capable of achieving improvement of transfer speed, improvement of transfer precision, and improvement of an aperture ratio.

BRIEF DESCRIPTION OF DRAWINGS

FIG. 8 is a diagram that illustrates a potential distribution for describing an operation of accumulating electric charge.
FIG. 9 is a diagram that illustrates a potential distribution for describing an operation of accumulating electric charge following FIG. 8.
FIG. 10 is a diagram that illustrates a potential distribution for describing an operation of discharging electric charge.

DESCRIPTION OF EMBODIMENTS

Figure 1:
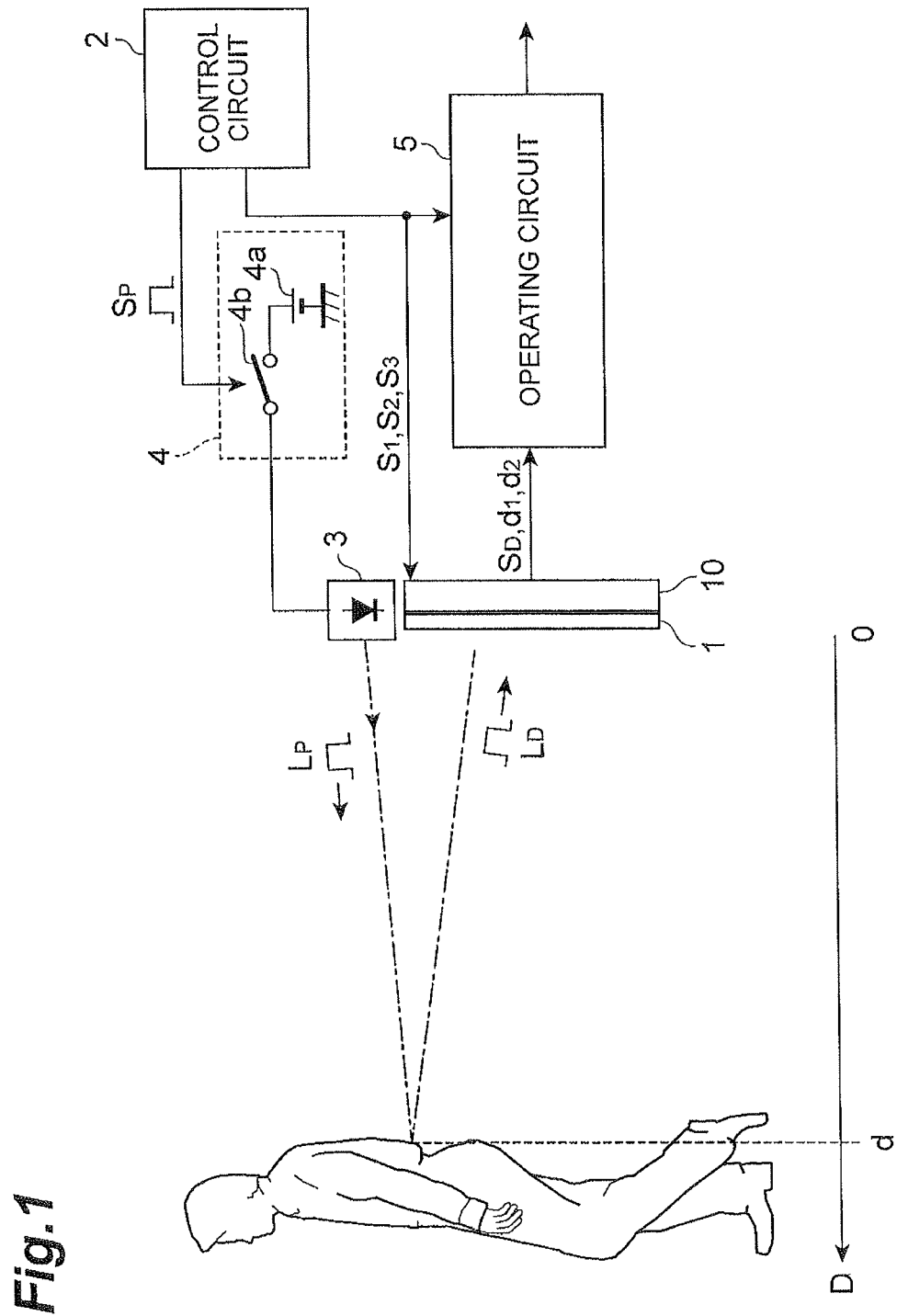
FIG. 1 is a configuration diagram of a distance measuring apparatus according to an embodiment.

Hereinafter, preferred embodiments of the present invention will be described in detail with reference to the accompanying drawings. In the description, the same reference numeral is used for the same elements or elements having the same function, and duplicate description thereof will not be presented.

FIG. 1 is a configuration diagram of a distance measuring apparatus according to an embodiment.

This distance measuring apparatus includes: a distance image sensor 1; a light source 3 that emits near infrared light; a drive circuit 4; a control circuit 2; and an operating circuit 5. The drive circuit 4 supplies a pulse drive signal Sp to the light source 3. The control circuit 2 supplies a detection gate signal $S_1$ synchronized with the pulse drive signal $S_P$ to first gate electrodes $TX1_1$ and $TX1_2$ (see FIG. 4) included in each distance sensor P1 (see FIG. 3) of the distance image sensor 1 as a charge transfer signal, supplies a detection gate signal $S_2$ having a phase different from the pulse drive signal $S_P$ and a detection gate signal $S_1$ to second gate electrodes $TX2_1$ and $TX2_2$ (see FIG. 4) as a charge transfer signal, and supplies a discharge gate signal $S_3$ to third gate electrodes $TX3_1$ and $TX3_2$ (see FIG. 4) as a charge transfer signal. The operating circuit 5 calculates a distance to a target object H such as a pedestrian based on signals $d_1$ and $d_2$, which are read from first semiconductor regions $FD1_1$ and $FD1_2$ (see FIG. 4) and second semiconductor regions $FD2_1$ and $FD2_2$ (see FIG. 4) of each distance sensor P1 and represent distance information. It is assumed that a distance from the distance image sensor 1 to the target object H in the horizontal direction D is "d".

The control circuit 2 inputs the pulse drive signal $S_P$ to a switch 4b of the drive circuit 4. The light source 3 configured by LEDs or laser diodes and used for floodlighting is connected to a power source 4a through the switch 4b. When the pulse drive signal $S_P$ is input to the switch 4b, a drive current having the same waveform as the pulse drive signal $S_P$ is supplied to the light source 3, and an emission pulse light $L_P$ as probe light used for measuring a distance is output from the light source 3. When the emission pulse light $L_P$ is emitted to the target object H, the pulse light is reflected by the target object H. The reflected pulse light is incident to the distance image sensor 1 as detection pulse light $L_D$. While the detection pulse light $L_D$ is incident to the distance image sensor 1, a pulse detection signal $S_D$ is output from the distance image sensor 1.

The distance image sensor 1 is arranged on a wiring substrate 10. The signals $d_1$ and $d_2$ each having distance information are output from each distance sensor P1 of the distance image sensor 1 through wirings formed on the wiring substrate 10.

Figure 2:
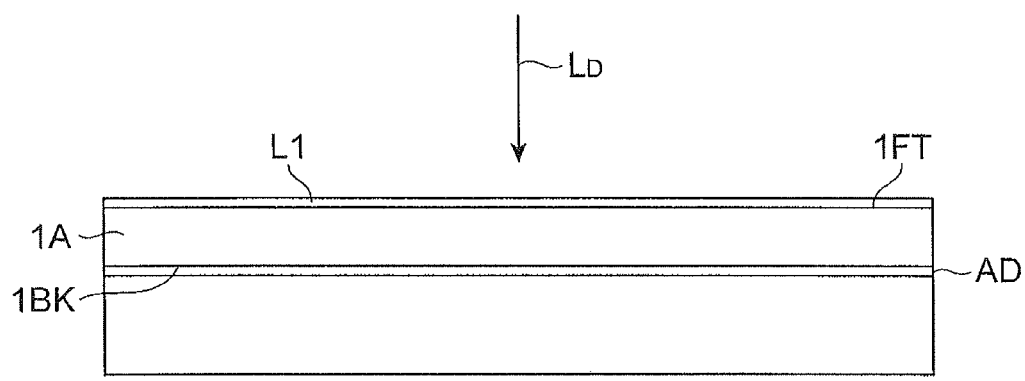
FIG. 2 is a cross-sectional view of a distance image sensor according to an embodiment.

FIG. 2 is a cross-sectional view of the distance image sensor according to the embodiment.

The distance image sensor 1 is a front-illuminated-type distance image sensor and includes a semiconductor substrate 1A. The semiconductor substrate 1A is formed by using Si or the like. The detection pulse light $L_D$ is incident to the distance image sensor 1 from a light incident surface 1FT of the semiconductor substrate 1A. A rear surface 1BK of the distance image sensor 1, which is on a side opposite to the light incident surface 1FT, is connected to the wiring substrate 10 through an adhesive region AD. The adhesive region AD contains an insulating adhesive, fillers, and the like. The distance image sensor 1 includes a light shielding layer LI in which an opening LIa (see FIGS. 5 to 7) is formed at a predetermined position. The light shielding layer LI is arranged on the front side of the light incident surface 1FT. The light shielding layer LI, for example, is formed using metal such as aluminum.

Figure 3:
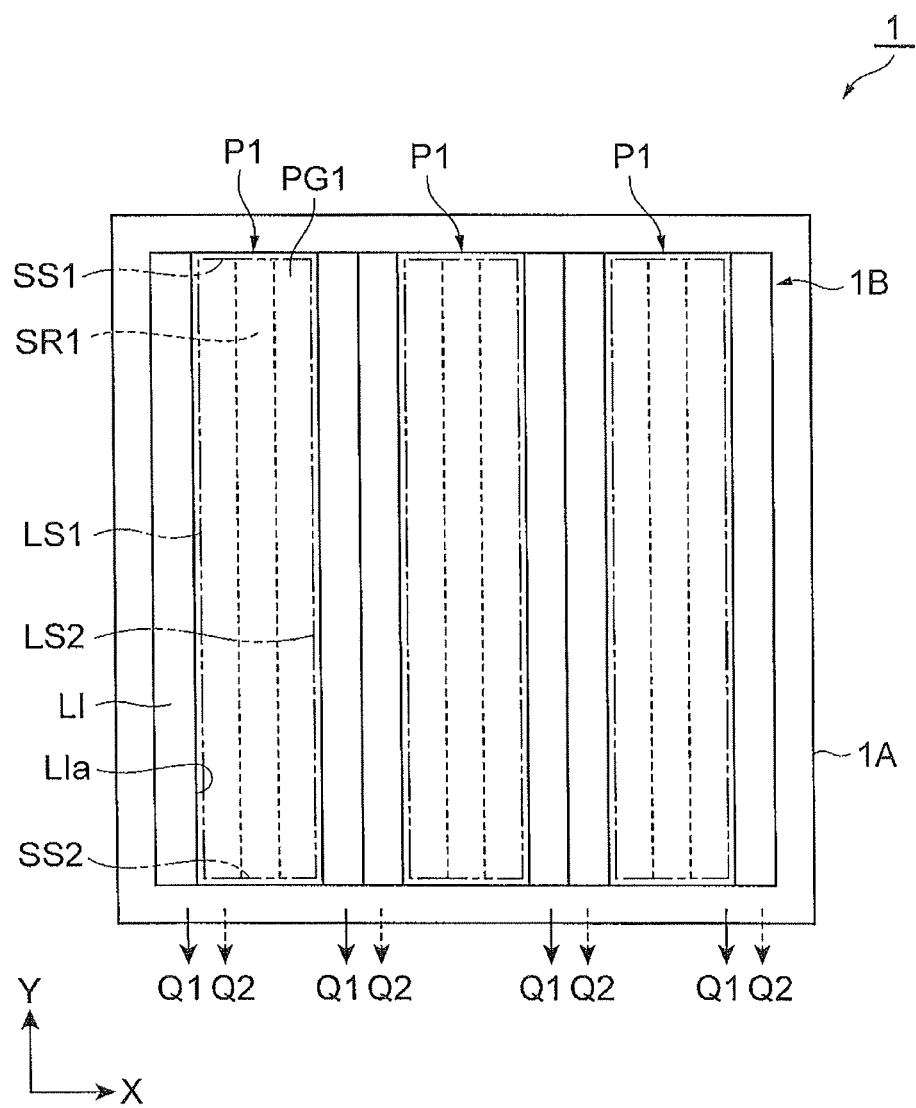
FIG. 3 is a plan view of the distance image sensor illustrated in FIG. 2.

FIG. 3 is a plan view of the distance image sensor illustrated in FIG. 2.

In the distance image sensor 1, the semiconductor substrate 1A has an imaging region 1B that is configured by a plurality of (here, three) distance sensors (units) P1 arranged in a one-dimensional pattern along the X direction. The imaging region 1B shows a rectangular shape (more specifically, a square shape). The distance sensor P1 shows a rectangular shape having the Y direction, which is perpendicular to the X direction, as its longitudinal direction in the plan view. In the distance sensor P1, a ratio of a shorter side to a longer side, for example, is about 1/3. An electric charge amount Q1 and an electric charge amount Q2 are output from the distance sensor P1 as the signals $d_1$ and $d_2$ having distance information described above. Between the distance sensors P1 and P1 that are adjacent to each other, a wiring used for outputting the electric charge amount Q1 is shared, and a wiring used for outputting the electric charge amount Q2 is shared. The distance sensor P1 is a micro range sensor and outputs the electric charge amount Q1 and the electric charge amount Q2 according to a distance to the target object H. Thus, by forming an image of the reflected light that is reflected from the target object H in the imaging region 1B, a distance image of the target object as an aggregation of distance information to each point on the target object H can be acquired. The distance sensor P1 serves as one pixel.

Figure 4:
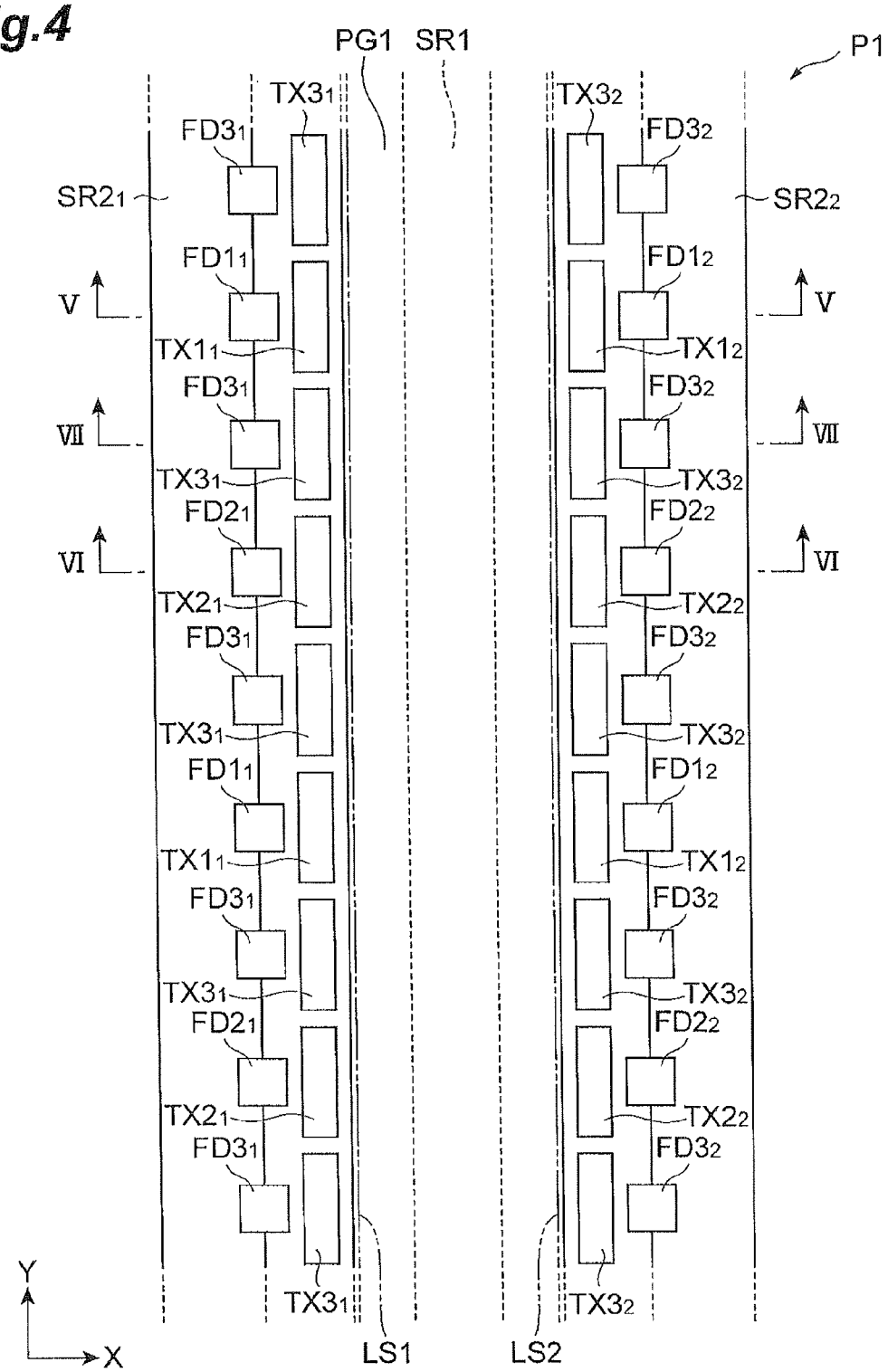
FIG. 4 is a plan view that illustrates a part of a distance sensor illustrated in FIG. 3.
Figure 5:
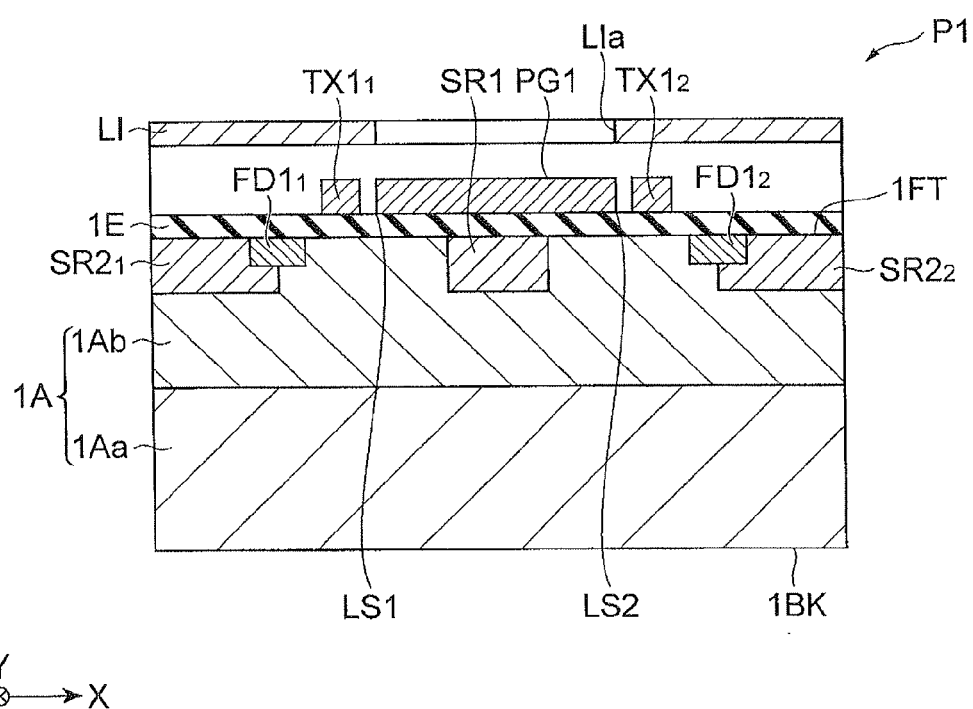
FIG. 5 is a cross-sectional view taken along line V-V illustrated in FIG. 4.
Figure 6:
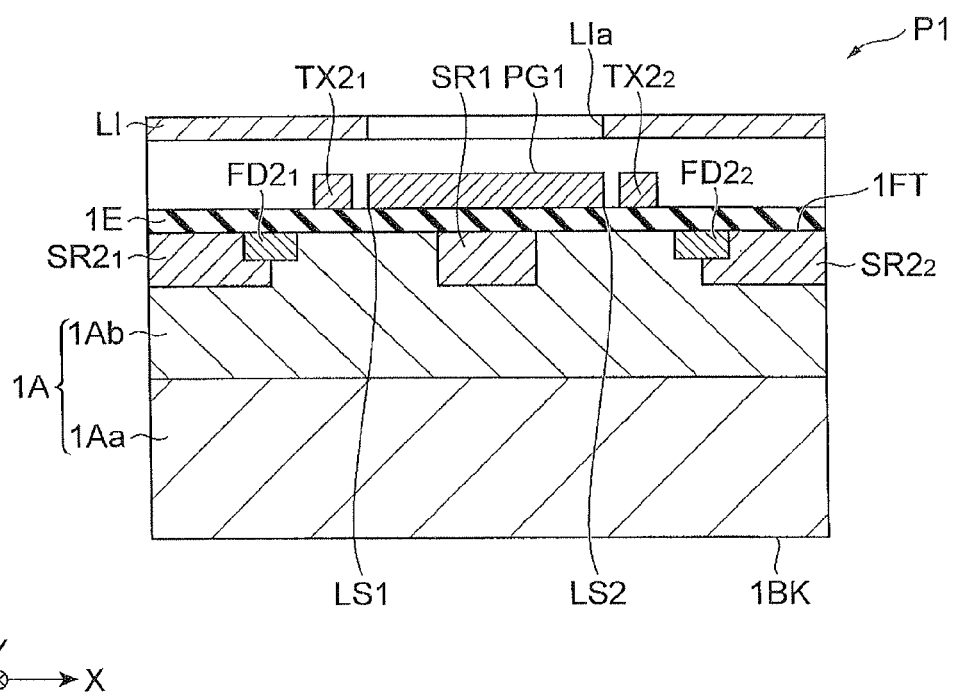
FIG. 6 is a cross-sectional view taken along line VI-VI illustrated in FIG. 4.
Figure 7:
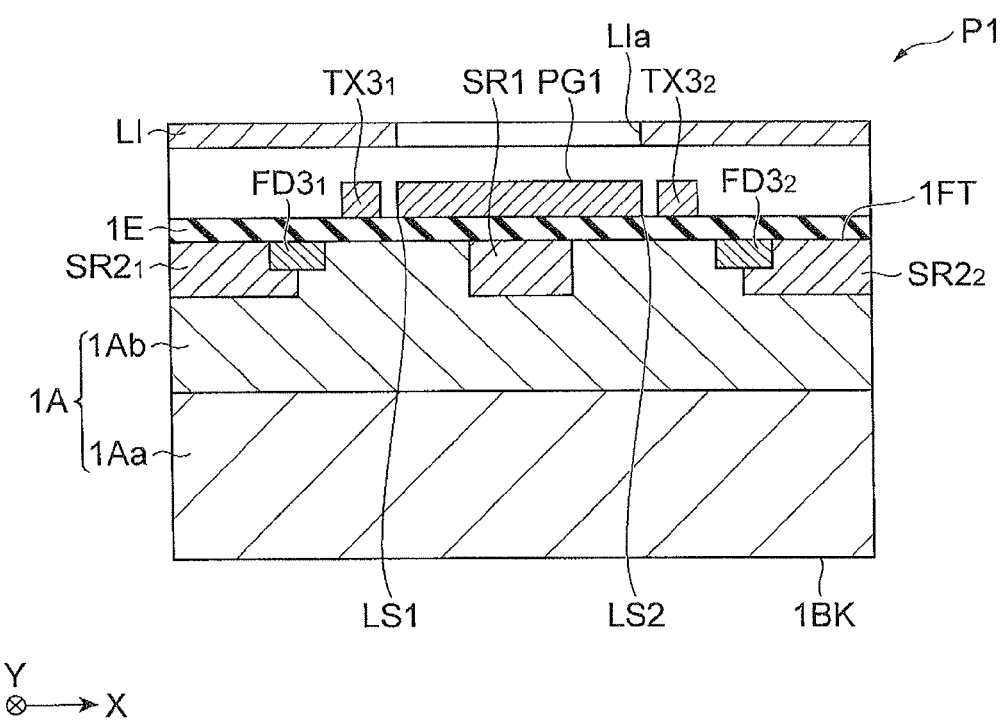
FIG. 7 is a cross-sectional view taken along line VII-VII illustrated in FIG. 4.

FIG. 4 is a plan view that illustrates a part of the distance sensor illustrated in FIG. 3. FIG. 5 is a cross-sectional view taken along line V-V illustrated in FIG. 4. FIG. 6 is a cross-sectional view taken along line VI-VI illustrated in FIG. 4. FIG. 7 is a cross-sectional view taken along line VII-VH illustrated in FIG. 4. In FIG. 4, the light shielding layer LI is not illustrated (this applies the same to FIGS. 12 to 19, 21, and 23).

The distance image sensor 1, as described above, includes the semiconductor substrate 1A that includes the light incident surface 1FT and the rear surface 1BK facing each other (see FIG. 2). The semiconductor substrate 1A has a p-type first substrate region 1Aa positioned on the rear surface 1BK side and a p-type second substrate region 1Ab positioned on the light incident surface 1FT side. The impurity concentration of the second substrate region 1Ab is lower than that of the first substrate region 1Aa. The semiconductor substrate 1A, for example, can be acquired by growing, on a p-type semiconductor substrate, a p-type epitaxial layer having impurity concentration lower than the semiconductor substrate.

The distance sensor P1 includes: a photo gate electrode PG1; a plurality of first semiconductor regions $FD1_1$ and $FD1_2$; a plurality of second semiconductor regions $FD2_1$ and $FD2_2$; a plurality of third semiconductor regions $FD3_1$ and $FD3_2$; a fourth semiconductor region SR1; fifth semiconductor regions $SR2_1$ and $SR2_2$; a plurality of first gate electrodes $TX1_1$ and $TX1_2$; a plurality of second gate electrodes $TX2_1$ and $TX2_2$; and a plurality of third gate electrodes $TX3_1$ and $TX3_2$.

The photo gate electrode PG1 is disposed on the light incident surface 1FT through an insulating layer 1E that is formed using $SiO_2$ or the like. The photo gate electrode PG1 is arranged in correspondence with the opening LIa formed in the light shielding layer LI. The shape of the opening LIa shows a rectangular shape having the Y direction as its longitudinal direction in the plan view. The photo gate electrode PG1 shows a shape corresponding to the opening LIa and shows a rectangular shape having the Y direction as its longitudinal direction in the plan view. The photo gate electrode PG1 is formed using polysilicon but may be formed using any other material, Light (reflected light from the target object H) is incident to the semiconductor substrate 1A through the opening LIa. A light receiving area is defined in the semiconductor substrate 1A by the opening LIa. The light receiving area corresponds to the shape of the opening LIa and shows a rectangular shape having the Y direction as its longitudinal direction. The light receiving area includes: first and second longer sides LS1 and LS2, which face each other in the X direction, extending in the Y direction; and first and second shorter sides SS1 and SS2, which face each other in the Y direction, extending in the X direction (see FIG. 3). The length of each of the first and second longer sides LS1 and LS2 is longer than a gap between the first and second longer sides LS1 and LS2.

In the light receiving area, an area corresponding to the photo gate electrode PG1 (an area right below the photo gate electrode PG1) serves as an electric charge generation region in which electric charge is generated according to incident light. In this embodiment, the shape of the light receiving area, the shape of the photo gate electrode PG1, and the shape of the electric charge generation region coincide with each other in the plan view. In each plan view, for the description, each side of the light receiving area and each side of the photo gate electrode PG1 are illustrated to be shifted.

In the light receiving area, an area that includes the first longer side LS1 and extends in a direction in which the first longer side LS1 extends is a first area. In addition, in the light receiving area, an area that includes the second longer side LS2 and extends in a direction in which the second longer side LS2 extends is a second area. Between the first area and the second area, the fourth semiconductor region SR1 is arranged.

An area (the first to third semiconductor regions $FD1_1$ to $FD3_2$, the fifth semiconductor region SR2, and an area including regions in which the first to third gate electrodes $TX1_1$ to $TX3_2$ are arranged) of the semiconductor substrate 1A other than the light receiving area are covered with the light shielding layer LI, and light is prevented from being incident to such an area. Accordingly, generation of unnecessary electric charge due to light incident to the area can be prevented.

In an area of the side of the first longer side LS1 that is separate from the light receiving area in the X direction, a plurality of first semiconductor regions $FD1_1$ are arranged to be separate from each other along the first longer side LS1. In an area of the side of the second longer side LS2 that is separate from the light receiving area in the X direction, a plurality of first semiconductor regions $FD1_2$ are arranged to be separate from each other along the second longer side LS2 and to respectively face the corresponding first semiconductor regions $FD1_1$ disposed on the side of the first longer side LS1 across the light receiving area. In this embodiment, the first semiconductor region $FD1_1$ disposed on the side of the first longer side LS1 and the first semiconductor region $FD1_2$ disposed on the side of the second longer side LS2 face each other in the X direction.

In the area of the side of the first longer side LS1 that is separate from the light receiving area in the X direction, a plurality of second semiconductor regions $FD2_1$ are arranged to be separate from each other along the first longer side LS1. In the area of the side of the second longer side LS2 that is separate from the light receiving area in the X direction, a plurality of second semiconductor regions $FD2_2$ are arranged to be separate from each other along the second longer side LS2 and to respectively face the corresponding second semiconductor regions $FD2_1$ disposed on the side of the first longer side LS1 across the light receiving area. The first semiconductor region $FD1_1$ and the second semiconductor region $FD2_1$ are alternately arranged in the Y direction to be separate from each other. The first semiconductor region $FD1_2$ and the second semiconductor region $FD2_2$ are alternately arranged in the Y direction to be separate from each other. In this embodiment, the second semiconductor region $FD2_1$ disposed on the side of the first longer side LSI and the second semiconductor region $FD2_2$ disposed on the side of the second longer side LS2 face each other in the X direction.

The first and second gate electrodes $TX1_1$ and $TX2_2$ are disposed on the light incident surface 1FT through the insulating layer 1E. A plurality of first gate electrodes $TX1_1$ are arranged to be separate from each other along the first longer side LS1 on the side of the first longer side LS1, and the first gate electrode $TX1_1$ is arranged between the corresponding first semiconductor region $FD1_1$ and the photo gate electrode PG1. A plurality of first gate electrodes $TX1_2$ are arranged to be separate from each other along the second longer side LS2 on the side of the second longer side LS2, and the first gate electrode $TX1_2$ is arranged between the corresponding first semiconductor region $FD1_2$ and the photo gate electrode PG1. The first gate electrodes $TX1_1$ disposed on the side of the first longer side LS1 and the first gate electrodes $TX1_2$ disposed on the side of the second longer side LS2 face each other in the X direction.

A plurality of second gate electrodes $TX2_1$ are arranged to be separate from each other along the first longer side LS1 on the side of the first longer side LS1, and the second gate electrode $TX2_1$ is arranged between the corresponding second semiconductor region $FD2_1$ and the photo gate electrode PG1. A plurality of second gate electrodes $TX2_2$ are arranged to be separate from each other along the second longer side LS2 on the side of the second longer side LS2, and the second gate electrode $TX2_2$ is arranged between the corresponding second semiconductor region $FD2_2$ and the photo gate electrode PG1. The first gate electrode $TX1_1$ and the second gate electrode $TX2_1$ are alternately disposed in the Y direction and are separate from each other. The first gate electrode $TX1_2$ and the second gate electrode $TX2_2$ are alternately disposed in the Y direction and are separate from each other. The second gate electrodes $TX2_1$ disposed on the side of the first longer side LS1 and second gate electrodes $TX2_2$ disposed on the side of the second longer side LS2 face each other in the X direction.

The first and second semiconductor regions $FD1_1$ to $FD2_2$ show a polygonal shape in the plan view. In this embodiment, the first and second semiconductor regions $FD1_1$ to $FD2_2$ show a rectangular shape (more specifically, a square shape). However, the shape of the first and second semiconductor regions $FD1_1$ to $FD2_2$ are not limited to a polygon. The first and second semiconductor regions $FD1_1$ to $FD2_2$ accumulate electric charge flowing into areas right below the corresponding first and second gate electrodes $TX1_1$ to $TX2_2$. The first and second semiconductor regions $FD1_1$ and $FD2_1$ disposed on the side of the first longer side LS1 serve as a first-side signal charge collection region. The first and second semiconductor regions $FD1_2$ and $FD2_2$ disposed on the side of the second longer side LS2 serve as a second-side signal charge collection region. The first and second semiconductor regions $FD1_1$ to $FD2_2$ are areas that are formed by n-type semiconductor having high impurity concentration and are floating diffusion areas.

Each of the first and second gate electrodes $TX1_1$ to $TX2_2$ shows a polygonal shape in the plan view. In this embodiment, each of the first and second gate electrodes $TX1_1$ to $TX2_2$ shows an approximately rectangular shape (more specifically, a rectangular shape having the Y direction as its longer-side direction). However, the shapes of the first and second gate electrodes $TX1_1$ to $TX2_2$ are not limited to a polygon. The first gate electrodes $TX1_1$ and $TX1_2$ selectively block and release the flow of signal charge to the first semiconductor regions $FD1_1$ and $FD1_2$, respectively, based on a given corresponding detection gate signal $S_1$. The second gate electrodes $TX2_1$ and $TX2_2$ selectively block and release the flow of signal charge to the second semiconductor regions $FD2_1$ and $FD2_2$, respectively, based on a given corresponding detection gate signal $S_2$. The first and second gate electrodes $TX1_1$ and $TX2_1$ disposed on the side of the first longer side LS1 serve as first-side transfer electrodes. The first and second gate electrodes $TX1_2$ and $TX2_2$ disposed on the side of the second longer side LS2 serve as second-side transfer electrodes. The first and second gate electrodes $TX1_1$ to $TX2_2$ may be formed using polysilicon or any other material.

In the area of the side of the first longer side LSI that is separate from the light receiving area in the X direction, a plurality of third semiconductor regions $FD3_1$ are arranged to be separate from each other along the first longer side LS1. In the area of the side of the second longer side LS2 that is separate from the light receiving area in the X direction, a plurality of third semiconductor regions $FD3_2$ are arranged to be separate from each other along the second longer side LS2 and to respectively face the corresponding third semiconductor regions $FD3_1$ disposed on the side of the first longer side LS1 across the light receiving area. The third semiconductor region $FD3_1$ is arranged to be separate from the first and second semiconductor regions $FD1_1$ and $FD2_1$ in the Y direction, and the third semiconductor region $FD3_2$ is arranged to be separate from the first and second semiconductor regions $FD1_2$ and $FD2_2$ in the Y direction. In this embodiment, the third semiconductor regions $FD3_1$ are arranged between all the first and second semiconductor regions $FD1_1$ and $FD2_1$ in the Y direction, and the third semiconductor regions $FD3_2$ are arranged between all the first and second semiconductor regions $FD1_2$ and $FD2_2$ in the Y direction. In addition, the third semiconductor regions $FD3_1$ may be also arranged at both ends in the Y direction so as to have all the first and second semiconductor regions $FD1_1$ and $FD2_1$ to be interposed therebetween in the Y direction, and the third semiconductor regions $FD3_2$ may be also arranged at both ends in the Y direction so as to have all the first and second semiconductor regions $FD1_2$ and $FD2_2$ to be interposed therebetween in the Y direction. The third semiconductor regions $FD3_1$ disposed on the side of the first longer side LS1 and the third semiconductor regions $FD3_2$ disposed on the side of the second longer side LS2 face each other in the X direction.

The third gate electrodes $TX3_1$ and $TX3_2$ are disposed on the light incident surface 1FT through the insulating layer 1E. A plurality of third gate electrodes $TX3_1$ are arranged to be separate from each other along the first longer side LS1 on the side of the first longer side LS1, and the third gate electrode $TX3_1$ is arranged between the corresponding third semiconductor region $FD3_1$ and the photo gate electrode PG1. A plurality of third gate electrodes TX3$_2$ are arranged to be separate from each other along the second longer side LS2 on the side of the second longer side LS2, and the third gate electrode TX3$_2$ is arranged between the corresponding third semiconductor region FD3$_2$ and the photo gate electrode PG1. The third gate electrode TX3$_1$ is arranged to be separate from the first and second gate electrodes TX1$_1$ and TX2$_1$ in the Y direction, and the third gate electrode TX3$_2$ is arranged to be separate from the first and second gate electrodes TX1$_2$ and TX2$_2$ in the Y direction. The third gate electrodes TX3$_1$ disposed on the side of the first longer side LS1 and the third gate electrodes TX3$_2$ disposed on the side of the second longer side LS2 face each other in the X direction.

The third semiconductor regions FD3$_1$ and FD3$_2$ show a polygonal shape in the plan view. In this embodiment, the third semiconductor regions FD3$_1$ and FD3$_2$ show a rectangular shape (more specifically, a square shape). However, the shapes of the third semiconductor regions FD3$_1$ and FD3$_2$ are not limited to a polygon.

The third semiconductor regions FD3$_1$ and FD3$_2$ discharge electric charge flowing into areas right below the corresponding third gate electrodes TX3$_1$ and TX3$_2$. The third semiconductor regions FD3$_1$ and FD3$_2$ serve as an unnecessary electric charge discharging region (unnecessary electric charge discharging drain) and, for example, are connected to fixed electric potential. The third semiconductor region FD3$_1$ disposed on the side of the first longer side LS1 serves as a first-side unnecessary electric charge discharging region. The third semiconductor region FD3$_2$ disposed on the side of the second longer side LS2 serves as a second-side unnecessary electric charge discharging region. The third semiconductor regions FD3$_1$ and FD3$_2$ are areas that are formed by n-type semiconductor having high impurity concentration and are floating diffusion areas.

Each of the third gate electrodes TX3$_1$ and TX3$_2$ shows a polygonal shape in the plan view. In this embodiment, each of the third gate electrodes TX3$_1$ and TX3$_2$ shows a rectangular shape (more specifically, a rectangular shape having the Y direction as its longer-side direction). However, the shapes of the third gate electrodes TX3$_1$ and TX3$_2$ are not limited to a polygon. The third gate electrodes TX3$_1$ and TX3$_2$ selectively block and release the flow of unnecessary electric charge to the third semiconductor regions FD3$_1$ and FD3$_2$, respectively, based on a given corresponding discharge gate signal S$_3$. The third gate electrodes TX3$_1$ disposed on the side of the first longer side LS1 serve as first-side unnecessary electric charge discharging gate electrodes. The third gate electrodes TX3$_2$ disposed on the side of the second longer side LS2 serve as second-side unnecessary electric charge discharging gate electrodes. The third gate electrodes TX3$_1$ and TX3$_2$ may be formed using polysilicon or any other material.

The fourth semiconductor region SR1 is arranged between the first and second longer sides LS1 and LS2 in an area right below the photo gate electrode PG1. The fourth semiconductor region SR1 shows a rectangular shape having the Y direction as its longer-side direction in the plan view. The fourth semiconductor region SR1 extends in the Y direction so as to combine the first shorter side SS1 and the second shorter side SS2 at a center portion between the first longer side LS1 and the second longer side LS2.

The fourth semiconductor region SR1 has the same conductivity type as that of the semiconductor substrate 1A and is a region having impurity concentration higher than that of the second substrate region 1Ab, in other words, formed by p-type semiconductor having high impurity concentration. The fourth semiconductor region SR1 may be a p-type well region or a p-type diffusion region.

The fifth semiconductor region SR2$_1$ is arranged to extend along the first longer side LS1 in an area disposed on the side of the first longer side LS1 that is separate from the light receiving area in the X direction. The fifth semiconductor region SR2$_2$ is arranged to extend along the second longer side LS2 in an area disposed on the side of the second longer side LS2 that is separate from the light receiving area in the X direction. Each of the fifth semiconductor regions SR2$_1$ and SR2$_2$ shows a rectangular shape having the Y direction as its longer-side direction in the plan view. The fifth semiconductor region SR2$_1$ is arranged along the longer side of the distance sensor P1 on the side of the first longer side LS1 and has a portion overlapping the first to third semiconductor regions FD1$_1$ to FD3$_1$ disposed on the side of the first longer side LS1 in the plan view. The fifth semiconductor region SR2$_2$ is arranged along the longer side of the distance sensor P1 on the side of the second longer side LS2 and has a portion overlapping the first to third semiconductor regions FD1$_2$ to FD3$_2$ disposed on the side of the second longer side LS2 in the plan view.

The fifth semiconductor regions SR2$_1$ and SR2$_2$ have the same conductivity type as that of the semiconductor substrate 1A and are regions having impurity concentration higher than that of the second substrate region 1Ab, in other words, formed by p-type semiconductor having high impurity concentration. The fifth semiconductor regions SR2$_1$ and SR2$_2$ may be p-type well regions or p-type diffusion regions. However, the fifth semiconductor regions SR2$_1$ and SR2$_2$ may not be disposed.

The thickness/impurity concentration of each region are as follows.

First Substrate Region 1Aa of Semiconductor Substrate 1A: Thickness of 5 to 700 μm/Impurity Concentration of $1 \times 10^{18}$ to $10^{20}$ cm$^{-3}$ Second Substrate Region 1Ab of Semiconductor Substrate 1A: Thickness of 3 to 50 μm/Impurity Concentration of $1 \times 10^{13}$ to $10^{16}$ cm$^{-3}$ First Semiconductor Regions FD1$_1$ and FD1$_2$: Thickness of 0.1 to 0.4 μm/Impurity Concentration of $1 \times 10^{18}$ to $10^{20}$ cm$^{-3}$ Second Semiconductor Regions FD2$_1$ and FD2$_2$: Thickness of 0.1 to 0.4 μm/Impurity Concentration of $1 \times 10^{18}$ to $10^{20}$ cm$^{-3}$ Third Semiconductor Regions FD3$_1$ and FD3$_2$: Thickness of 0.1 to 0.4 μm/Impurity Concentration of $1 \times 10^{18}$ to $10^{20}$ cm$^{-3}$ Fourth Semiconductor Region SR1: Thickness of 1 to 5 μm/Impurity Concentration of $1 \times 10^{16}$ to $10^{18}$ cm$^{-3}$ Fifth Semiconductor Region SR2: Thickness of 1 to 5 μm/Impurity Concentration of $1 \times 10^{16}$ to $10^{18}$ cm$^{-3}$ In the insulating layer 1E, contact holes (not illustrated in the figure) used for exposing the surfaces of the first to third semiconductor regions FD1$_1$ to FD3$_2$ are disposed. Inside the contact holes, conductors (not illustrated in the figure) used for connecting the first to third semiconductor regions FD1$_1$ to FD3$_2$ to the outside are arranged.

When a high-level signal (positive electric potential) is applied to the first gate electrodes TX1$_1$ and TX1$_2$, the potential of areas right below the first gate electrodes TX1$_1$ and TX1$_2$ becomes lower than that of an area right below the photo gate electrode PG1 of the semiconductor substrate 1A. Accordingly, negative electric charge (electron) is attracted in the directions of the first gate electrodes TX1 and TX1$_2$ and is accumulated inside potential wells formed by the first semiconductor regions FD 1$_1$ and FD1$_2$. The first gate electrodes $TX1_1$ and $TX1_2$ cause signal charge to flow into the first semiconductor regions $FD1_1$ and $FD1_2$ according to an input signal. The n-type semiconductor contains positively ionized donors, has positive potential, and attracts electrons. When a low-level signal (for example, ground electric potential) is applied to the first gate electrodes $TX1_1$ and $TX1_2$, potential walls according to the first gate electrodes $TX1_1$ and $TX1_2$ are formed. Accordingly, electric charge generated in the semiconductor substrate 1A is not attracted to the insides of the first semiconductor regions FD $1_1$ and $FD1_2$.

When a high-level signal is applied to the second gate electrodes $TX2_1$ and $TX2_2$, the potential of areas right below the second gate electrodes $TX2_1$ and $TX2_2$ becomes lower than that of the area right below the photo gate electrode PG1 of the semiconductor substrate 1A.

Accordingly, negative electric charge is attracted in the directions of the second gate electrodes $TX2_1$ and $TX2_2$ and is accumulated inside potential wells formed by the second semiconductor regions $FD2_1$ and $FD2_2$. The second gate electrodes $TX2_1$ and $TX2_2$ cause signal charge to flow into the second semiconductor regions $FD2_1$ and $FD2_2$ according to an input signal. When a low-level signal is applied to the second gate electrodes $TX2_1$ and $TX2_2$, potential walls according to the second gate electrodes $TX2_1$ and $TX2_2$ are formed. Accordingly, electric charge generated in the semiconductor substrate 1A is not attracted to the insides of the second semiconductor regions $FD2_1$ and $FD2_2$.

When a high-level signal is applied to the third gate electrodes $TX3_1$ and $TX3_2$, the potential of areas right below the third gate electrodes $TX3_1$ and $TX3_2$ becomes lower than that of the area right below the photo gate electrode PG1 of the semiconductor substrate 1A. Accordingly, negative electric charge is attracted in the directions of the third gate electrodes $TX3_1$ and $TX3_2$ and is discharged through potential wells formed by the third semiconductor regions $FD3_1$ and $FD3_2$. When a low-level signal is applied to the third gate electrodes $TX3_1$ and $TX3_2$, potential walls according to the third gate electrodes $TX3_1$ and $TX3_2$ are formed. Accordingly, electric charge generated in the semiconductor substrate 1A is not attracted to the insides of the third semiconductor regions $FD3_1$ and $FD3_2$. A part of electric charge generated in the electric charge generation regions according to the incidence of light is discharged to the third semiconductor regions $FD3_1$ and $FD3_2$ as unnecessary electric charge.

The detection pulse light $L_D$ from the target object which incident from the light incident surface 1FT of the semiconductor substrate 1A reaches the light receiving area (electric charge generation region) on the front side of the semiconductor substrate 1A. The electric charge generated inside the semiconductor substrate 1A according to the incidence of the detection pulse light $L_D$ is transferred from the electric charge generation region to the areas right below the first gate electrodes $TX1_1$ and $TX1_2$ or the second gate electrodes $TX2_1$ and $TX2_2$ that are adjacent to the electric charge generation region. In other words, when a detection gate signal $S_1$ synchronized with the pulse drive signal Sp of the light source is applied to the first gate electrodes $TX1_1$ and $TX1_2$ through the wiring board 10, electric charge generated in the electric charge generation regions flows into the areas right below the first gate electrodes $TX1_1$ and $TX1_2$ and flows therefrom into the first semiconductor regions $FD1_1$ and $FD1_2$. When a detection gate signal $S_2$ having a phase different from those of the pulse drive signal $S_P$ of the light source and the detection gate signal $S_1$ is applied to the second gate electrodes $TX2_1$ and $TX2_2$ through the wiring board 10, electric charge generated in the electric charge generation regions flows into the areas right below the second gate electrodes $TX2_1$ and $TX2_2$ and flows therefrom into the second semiconductor regions $FD2_1$ and $FD2_2$.

The distance image sensor 1, although not illustrated in the figure, includes a back gate semiconductor region that is used for fixing the electric potential of the semiconductor substrate 1A to reference electric potential.

FIGS. 8 and 9 are diagrams that illustrate potential distributions for describing operations of accumulating electric charge. FIG. 10 is a diagram that illustrates a potential distribution for describing an operation of discharging electric charge. Here, (a) of FIGS. 8 to 10 illustrates potential distributions on a cross-section taken along line V-V illustrated in FIG. 4, (b) of FIGS. 8 to 10 illustrates potential distributions on a cross-section taken along line VI-VI illustrated in FIG. 4, and (c) of FIGS. 8 to 10 illustrates potential distributions on a cross-section taken along line VH-VII illustrated in FIG. 4.

When light is incident, the potential $\phi PG1$ of the electric charge generation region is set to be slightly higher than the reference potential by an electric potential applied to the photo gate electrode PG1 (for example, intermediate electric potential between highest electric potential and lowest electric potential among electric potentials applied to the first to third gate electrodes $TX1_1$ to $TX3_2$). In each figure, the potentials $\phi TX1_1$ and $\phi TX1_2$ of the areas right below the first gate electrodes $TX1_1$ and $TX1_2$, the potentials $_T TX2_1$ and $\phi TX2_2$ of the areas right below the second gate electrodes $TX2_1$ and $TX2_2$, the potentials $\phi TX3_1$ and $\phi TX3_2$ of the areas right below the third gate electrodes $TX3_1$ and $TX3_2$, the potentials $\phi FD1_1$ and $\phi FD1_2$ of the first semiconductor regions $FD1_1$ and $FD1_2$, the potentials $\phi FD2_1$ and $\phi FD2_2$ of the second semiconductor regions $FD2_1$ and $FD2_2$, the potentials $\phi FD3_1$ and $\phi FD3_2$ of the third semiconductor regions $FD3_1$ and $FD3_2$, and the potential $\phi SR1$ of the fourth semiconductor region SR1 are illustrated.

A detection gate signal $S_1$ is applied to the first gate electrodes $TX1_1$ and $TX1_2$ as a charge transfer signal. When the high electric potential of the detection gate signal $S_1$ is input to the first gate electrodes $TX1_1$ and $TX1_2$, as illustrated in (a) of FIG. 8, electric charge generated in the electric charge generation region (the area right below the photo gate electrode PG1) is accumulated in potential wells of the first semiconductor regions $FD1_1$ and $FD1_2$ through the areas right below the first gate electrodes $TX1_1$ and $TX1_2$ along a potential gradient. Inside the potential wells of the first semiconductor regions $FD1_1$ and $FD1_2$, the electric charge amount Q1 is accumulated according to a pulse timing of the detection gate signal $S_1$. A voltage output $V_{out1}$ corresponding to the accumulated electric charge amount Q1 is read from the first semiconductor regions $FD1_1$ and $FD1_2$. The voltage output $V_{out1}$ corresponds to the signal $d_1$ described above.

At this time, in the area right below the photo gate electrode PG1, the potential $\phi SR1$ of the fourth semiconductor region SR1 positioned at a center portion in the X direction is higher than the potential $\phi PG1$ of the sides of the first longer side LS1 and the second longer side LS2. Accordingly, in the area right below the photo gate electrode PG1, a high potential area extending in the Y direction is formed between the first longer side LS1 and the second longer side LS2, and a much steeper gradient of potential decreasing from the fourth semiconductor region SR1 toward the first longer side LS1 and the second longer side LS2 is formed.

The electric charge generated in the electric charge generation region speedily moves toward the first semiconductor region $FD1_1$ on the side of the first longer side LS1 and the first semiconductor region $FD1_2$ on the side of the second longer side LS2 according to the above-described potential gradient formed by the fourth semiconductor region SR1.

As illustrated in (b) and (c) of FIG. 8, while the detection gate signal $S_1$ is applied to the first gate electrodes $TX1_1$ and $TX1_2$, low-level electric potential (for example, ground electric potential) is applied to the second gate electrodes $TX2_1$ and $TX2_2$ and the third gate electrodes $TX3_1$ and $TX3_2$. Accordingly, the potentials $\phi TX2_1$ and $TX2_2$ and the potentials $\phi TX3_1$ and $TX3_2$ are not lowered, and electric charge does not flow into the insides of the potential wells of the second semiconductor regions $FD2_1$ and $FD2_2$ and the third semiconductor regions $FD3_1$ and $FD3_2$.

A detection gate signal $S_2$ is applied to the second gate electrodes $TX2_1$ and $TX2_2$ as a charge transfer signal. When the high electric potential of the detection gate signal $S_2$ is input to the second gate electrodes $TX2_1$ and $TX2_2$, as illustrated in (b) of FIG. 9, electric charge generated in the electric charge generation region is accumulated in potential wells of the second semiconductor regions $FD2_1$ and $FD2_2$ through the areas right below the second gate electrodes $TX2_1$ and $TX2_2$ along a potential gradient. Inside the potential wells of the second semiconductor regions $FD2_1$ and $FD2_2$, the electric charge amount Q2 is accumulated according to a pulse timing of the detection gate signal $S_2$. A voltage output $V_{out2}$ corresponding to the accumulated electric charge amount Q2 is read from the second semiconductor regions $FD2_1$ and $FD2_2$. The voltage output $V_{out2}$ corresponds to the signal $d_2$ described above.

The electric charge generated in the electric charge generation region speedily moves toward the second semiconductor region $FD2_1$ on the side of the first longer side LS1 and the second semiconductor region $FD2_2$ on the side of the second longer side LS2 according to the above-described potential gradient formed by the fourth semiconductor region SR1.

As illustrated in (a) and (c) of FIG. 9, while the detection gate signal $S_2$ is applied to the second gate electrodes $TX2_1$ and $TX2_2$, low-level electric potential is applied to the first gate electrodes $TX1_1$ and $TX1_2$ and the third gate electrodes $TX3_1$ and $TX3_2$. Accordingly, the potentials $\phi TX1_1$ and $TX1_2$ and the potentials $\phi TX3_1$ and $TX3_2$ are not lowered, and electric charge does not flow into the insides of the potential wells of the first semiconductor regions $FD1_1$ and $FD1_2$ and the third semiconductor regions $FD3_1$ and $FD3_2$.

A discharge gate signal $S_3$ is applied to the third gate electrodes $TX3_1$ and $TX3_2$. When the high electric potential of the discharge gate signal $S_3$ is input to the third gate electrodes $TX3_1$ and $TX3_2$, as illustrated in (c) of FIG. 10, electric charge generated in the electric charge generation region flows into the insides of the potential wells of the third semiconductor regions $FD3_1$ and $FD3_2$ through the areas right below the third gate electrodes $TX3$ and $TX3_2$ along the potential gradient as unnecessary electric charge. The unnecessary electric charge flowing into the potential wells of the third semiconductor regions $FD3_1$ and $FD3_2$ is discharged to the outside. While positive electric potential is applied to the third gate electrodes $TX3_1$ and $TX3_2$, low-level electric potential is applied to the first gate electrodes $TX1_1$ and $TX1_2$ and the second gate electrodes $TX2_1$ and $TX2_2$. Accordingly, as illustrated in (a) and (b) of FIG. 10, the potentials $\phi TX1_1$ and $TX1_2$ and the potentials $\phi TX2_1$ and $TX2_2$ are not lowered, and electric charge does not flow into the insides of the potential wells of the first semiconductor regions $FD1_1$ and $FD1_2$ and the second semiconductor regions $FD2_1$ and $FD2_2$.

Figure 11:
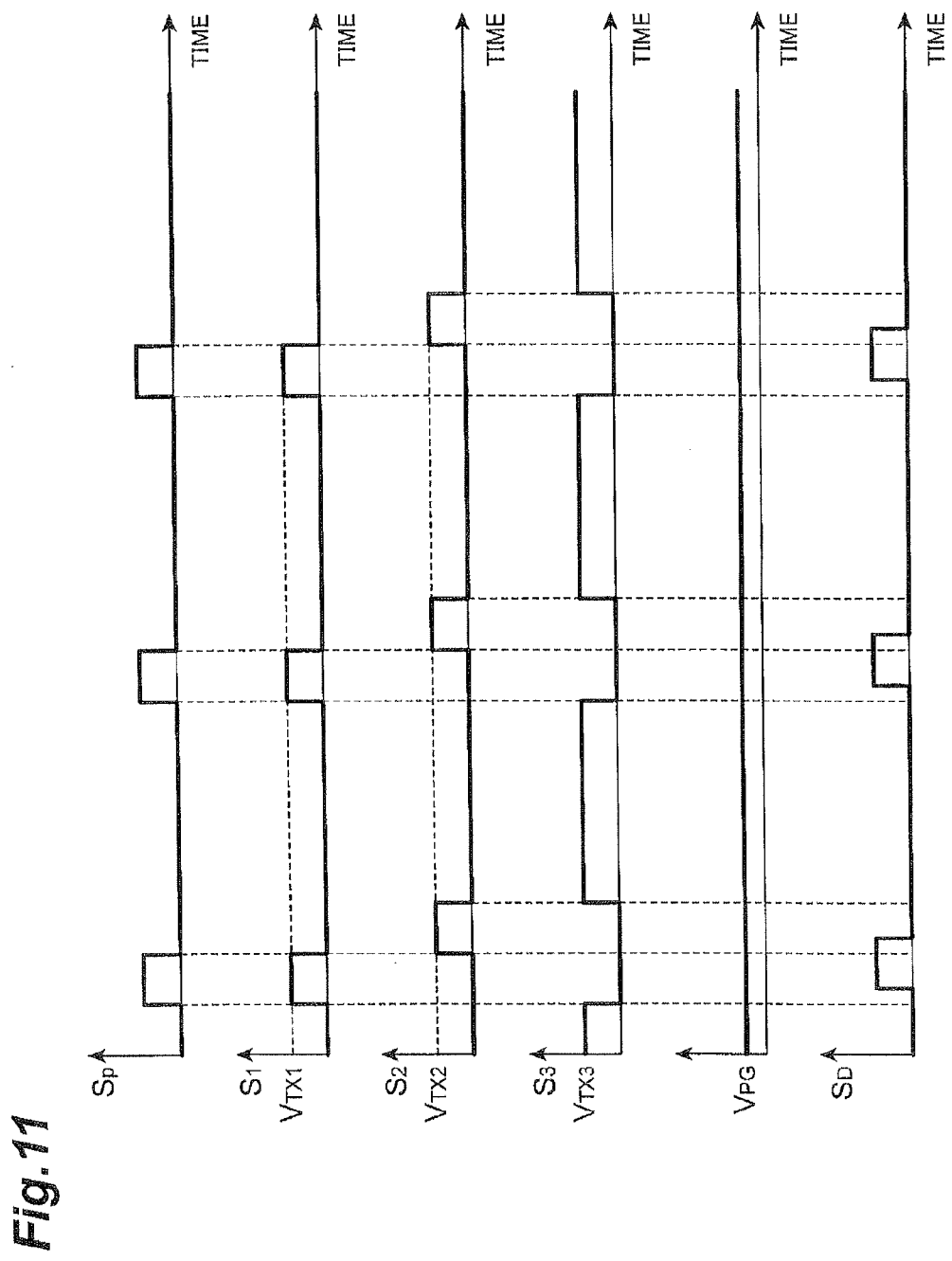
FIG. 11 is a timing diagram of various signals.

FIG. 11 is a timing diagram of various signals.

One frame period is configured by a period during which signal charge is accumulated (accumulation period) and a period during which the signal charge is read (reading period). When one distance sensor P1 is considered, during the accumulation period, a signal that is based on a pulse drive signal $S_P$ is applied to the light source, and a detection gate signal $S_1$ is applied to the first gate electrodes $TX1_1$ and $TX1_2$ in synchronization therewith. Subsequently, a detection gate signal $S_2$ is applied to the second gate electrodes $TX2_1$ and $TX2_2$ with a predetermined phase difference from the detection gate signal $S_1$ (for example, a phase difference of 180 degrees). In other words, charge transfer signals having mutually-differing phases are applied to the first and second gate electrodes $TX1_1$ and $TX2_1$ on the side of the first longer side LS1, and the charge transfer signals having mutually-differing phases are applied to the first and second gate electrodes $TX1_2$ and $TX2_2$ on the side of the second longer side LS2. Before the distance is measured, a reset signal is applied to the first and second semiconductor regions $FD1_1$ to $FD2_2$, and electric charge accumulated inside is discharged to the outside. After the reset signal is momentarily in the On state and then is continuously in the Off state, pulses of the detection gate signals $S_1$ and $S_2$ are sequentially applied to the first and second gate electrodes $TX1_1$ to $TX2_2$, and electric charge is transferred. Then, the signal charge is added up to be accumulated inside the first and second semiconductor regions $FD1_1$ to $FD2_2$.

Thereafter, during a reading period, signal charges accumulated inside the first and second semiconductor regions $FD1_1$ to $FD2_2$ are read. At this time, the discharge gate signal $S_3$ applied to the third gate electrodes $TX3_1$ and $TX3_2$ is in the high level, positive electric potentials are applied to the third gate electrodes $TX3_1$ and $TX3_2$, and unnecessary electric charge is collected in the potential wells of the third semiconductor regions $FD3_1$ and $FD3_2$.

An electric potential $V_{PG}$ applied to the photo gate electrode PG1 is set to be lower than the electric potentials $VTX1_1$, $VTX1_2$, $VTX2_1$, $VTX2_2$, $VTX3_1$, and $VTX3_2$. Accordingly, when the detection gate signals $S_1$ and $S_2$ become in the high level, the potentials $\phi TX1_1$, $\phi TX1_2$, $\phi TX2_1$, and $\phi TX2_2$ are lower than the potential $\phi PG1$. When the discharge gate signal $S_3$ becomes in the high level, the potentials $\phi TX3_1$ and $\phi TX3_2$ are lower than the potential $\phi PG1$.

The electric potential $V_{PG}$ is set to be higher than the electric potential at a time when the detection gate signals $S_1$ and $S_2$ and the discharge gate signal $S_3$ are in the low level. When the detection gate signals $S_1$ and $S_2$ become in the low level, the potentials $\phi TX1_1$, $\phi TX1_2$, $\phi TX2_1$, and $\phi TX2_2$ are higher than the potential $\phi PG1$. When the discharge gate signal S3 becomes in the low level, the potentials $\phi TX3_1$ and $\phi TX3_2$ are higher than the potential $\phi PG1$.

It is assumed that the pulse width of each of the pulse signals $S_P$, $S_1$, $S_2$, and $S_D$ is $T_P$. When the detection gate signal $S_1$ synchronized with the pulse drive signal $S_P$ is in the high level, and the pulse detection signal $S_D$ is in the high level, the amount of electric charge generated inside the distance sensor P1 (the amount of electric charge accumulated inside the first semiconductor regions $FD1_1$ and $FD1_2$) is Q1. When the detection gate signal $S_2$ having a phase difference of 180 degrees from the pulse drive signal $S_P$ is in the high level, and the pulse detection signal $S_D$ is in the high level, the amount of electric charge generated inside the distance sensor P1 (the amount of electric charge accumulated inside the second semiconductor regions $FD2_1$ and $FD2_2$) is Q2.

A phase difference between the detection gate signal $S_1$ and the pulse detection signal $S_D$ (a phase difference between the emission pulse light $L_P$ and the detection pulse light $L_D$) is in proportion to the above-described electric charge amount Q2. When a total amount of electric charge generated inside one pixel is Q1+Q2, the pulse detection signal $S_D$ lags a period of $\Delta t = T_P \times Q2/(Q1+Q2)$ behind the pulse drive signal $S_P$. When a distance up to the target object is d, and the speed of light is c, the flight time $\Delta t$ of one pulse light is given as $\Delta t = 2d/c$. For this reason, when two electric charge amounts Q1 and Q2 are output as signals $d_1$ and $d_2$ having distance information from a specific pixel, the operating circuit 5 calculates the distance d to the target object H by using $d=(c \times \Delta t)/2 = c \times T_P \times Q2/(2 \times (Q1+Q2))$ based on the input electric charge amounts Q1 and Q2 and the pulse width $T_P$ determined in advance.

As described above, by separately reading the electric charge amounts Q1 and Q2, the operating circuit 5 can calculate the distance d. Note that the above-described pulse is repeatedly output, and integral values thereof can be output as the electric charge amounts Q1 and Q2.

The ratios of the electric charge amounts Q1 and Q2 to a total electric charge amount correspond to the phase difference described above, in other words, a distance up to the target object H. The operating circuit 5 calculates a distance up to the target object H according to the phase difference. As described above, when a time difference corresponding to the phase difference is $\Delta t$, the distance d is preferably given as $d=(c \times \Delta t)/2$. An appropriate correction operation may be added to the above-described calculation. For example, in a case where an actual distance and the calculated distance d are different from each other, it may be configured such that a coefficient β correcting the calculated distance is acquired in advance, and a final calculated distance d is acquired by multiplying the calculated distance d by the coefficient in a product after shipment. In addition, it may be configured such that outside air temperature is measured, and, in a case where the speed c of light is different according to the outside air temperature, after calculation for correcting the speed c of light is performed, the distance calculation is performed. Furthermore, it may be configured such that a relation between a signal input to the operating circuit and an actual distance is stored in a memory in advance, and the distance is calculated using a lookup table method. The calculation method may be changed based on the sensor structure, and a calculation method that has been conventionally known may be used for this.

As above, in the distance sensor P1 of the distance image sensor 1 according to this embodiment, high potential is generated in the area right below the fourth semiconductor region SR1 positioned between the first longer side LS1 and the second longer side LS2 of the light receiving area, and inclination of the potential is formed toward the first longer side LS1 and the second longer side LS2. Accordingly, among signal charges generated according to the incident light, signal charge generated in an area right below a portion of the photo gate electrode PG1 on the side of the first longer side LS1 is accelerated toward the first longer side LS1, and signal charge generated in an area right below a portion of the photo gate electrode PG1 on the side of the second longer side LS2 is accelerated toward the second longer side LS2. Thus, the transfer speed can be improved.

In the distance sensor P1, high potential is generated between the first longer side LS1 and the second longer side LS2, and inclination of the potential is formed toward both the first longer side LS1 and the second longer side LS2. For example, the moving distance of the signal charge is shorter than that of a case where the first and second gate electrodes TX1 and TX2 are arranged along only one of the first and second longer sides LS1 and LS2, and inclination of the potential is formed from the other of the first and second longer sides LS1 and LS2 toward the one thereof. Accordingly, the transfer speed can be improved.

Since the fourth semiconductor region SR1 that is a potential adjusting means is shared by the area right below the portion of the photo gate electrode PG1 on the side of the first longer side LS1 and the area right below the portion of the photo gate electrode PG1 on the side of the second longer side LS2, the use efficiency of the area is improved. Accordingly, the aperture ratio can be improved.

The charge transfer signals $S_1$ and $S_2$ having mutually-differing phases are input to the plurality of first-side transfer electrodes ($TX1_1$ and $TX2_1$), and the charge transfer signals $S_1$ and $S_2$ having the mutually-differing phases are also input to the plurality of second-side transfer electrodes ($TX1_2$ and $TX2_2$). Thus, even when any one of the charge transfer signals $S_1$ and $S_2$ is given, the signal charges generated in both the area right below the portion of the photo gate electrode PG1 on the side of the first longer side LS1 and the area right below the portion of the photo gate electrode PG1 on the side of the second longer side LS2 can be acquired. Accordingly, a failure in collection of the signal charge decreases, and the transfer precision can be improved.

Since the charge transfer signals $S_1$ and $S_2$ having mutually-differing phases are input to the plurality of first-side transfer electrodes ($TX1_1$ and $TX2_1$), and the charge transfer signals $S_1$ and $S_2$ having the mutually-differing phases are also input to the plurality of second-side transfer electrodes ($TX1_2$ and $TX2_2$), the influence of manufacturing variations in the X direction in which the first longer side LS1 and the second longer side LS21 face each other can be reduced to be smaller than that of a case where only charge transfer signals having one phase are input to the first-side transfer electrode and the second-side transfer electrode, respectively. Accordingly, the transfer precision can be improved.

Since the distance sensor P1 includes the third semiconductor regions $FD3_1$ and $FD3_2$ and the third gate electrodes $TX3_1$ and $TX3_2$ on the sides of the first longer side LS1 and the second longer side LS2, respectively, unnecessary electric charge can be discharged, and accordingly, the transfer precision can be improved.

Since the light receiving area includes the first area and the second area, and the potential adjusting means is the fourth semiconductor region SR1 having high impurity concentration arranged between the first area and the second area, high potential can be generated using a simple configuration.

Figure 12:
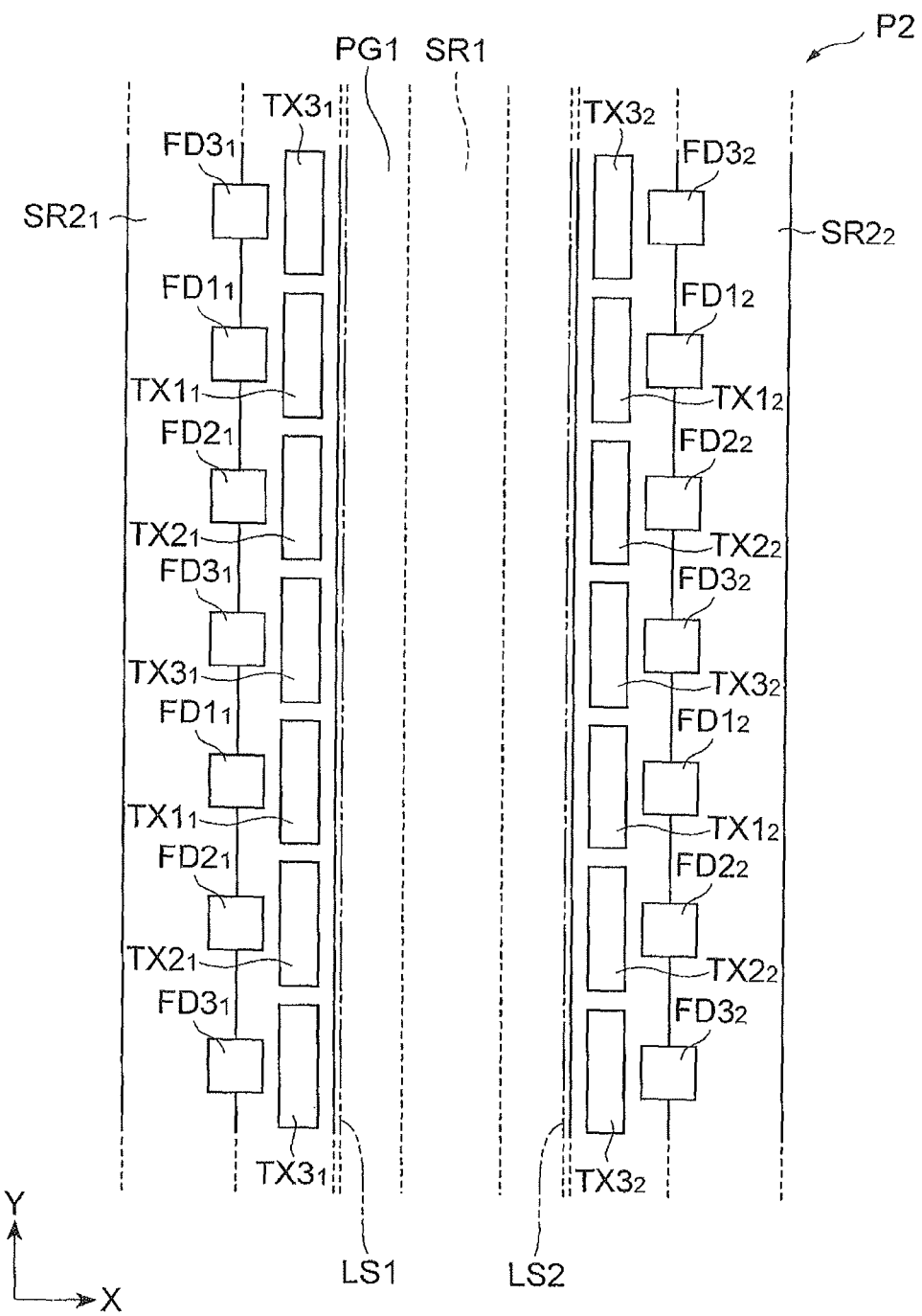
FIG. 12 is a plan view that illustrates a part of a distance sensor according to another embodiment.

Subsequently, the configuration of a distance sensor according to another embodiment will be described. FIG. 12 is a plan view that illustrates a part of the distance sensor according to another embodiment.

As illustrated in FIG. 12, a distance sensor P2 according to this embodiment differs in that the number of the third semiconductor regions $FD3_1$ and $FD3_2$ and the third gate electrodes $TX3_1$ and $TX3_2$ is smaller, compared to the above-described distance sensor P1 (see FIG. 4).

In the distance sensor P2, the third semiconductor region $FD3_1$ is alternately arranged between the first semiconductor region $FD1_1$ and the second semiconductor region $FD2_1$ in the Y direction, and the third semiconductor region $FD3_2$ is alternately arranged between the first semiconductor region $FD1_2$ and the second semiconductor region $FD2_2$ in the Y direction. The third semiconductor regions $FD3_1$ and $FD3_2$ may be arranged at both ends in the Y direction. The third gate electrode $TX3_1$ is alternately arranged between the first gate electrode $TX1_1$ and the second gate electrode $TX2_1$ in the Y direction, and the third gate electrode $TX3_2$ is alternately arranged between the first gate electrode $TX1_2$ and the second gate electrode $TX2_2$ in the Y direction.

In the distance sensor P2 according to this embodiment, since inclination of the potential is formed from the area right below the fourth semiconductor region SR1 toward the first longer side LS1 and the second longer side LS2, the transfer speed can be improved.

Since the fourth semiconductor region SR1 that is a potential adjusting means is shared by the area right below the portion of the photo gate electrode PG1 on the side of the first longer side LS1 and the area right below the portion of the photo gate electrode PG1 on the side of the second longer side LS2, the use efficiency of the area is improved. Accordingly, the aperture ratio can be improved.

Since the charge transfer signals $S_1$ and $S_2$ having mutually-differing phases are input to the plurality of first-side transfer electrodes ($TX1_1$ and $TX2_1$), and the charge transfer signals $S_1$ and $S_2$ having the mutually-differing phases are also input to the plurality of second-side transfer electrodes ($TX1_2$ and $TX2_2$), a failure in collection of the signal charge decreases, and the influence of manufacturing variations in the X direction is reduced. Accordingly, the transfer precision can be improved.

Since the distance sensor P2 includes the third semiconductor regions $FD3_1$ and $FD3_2$ and the third gate electrodes $TX3_1$ and $TX3_2$ on the side of the first longer side LS1 and the side of the second longer side LS2, respectively, unnecessary electric charge can be discharged. Accordingly, the transfer precision can be improved.

Since the light receiving area includes the first area and the second area, and the potential adjusting means is the fourth semiconductor region SR1 having high impurity concentration arranged between the first area and the second area, high potential can be generated using a simple configuration.

Figure 13:
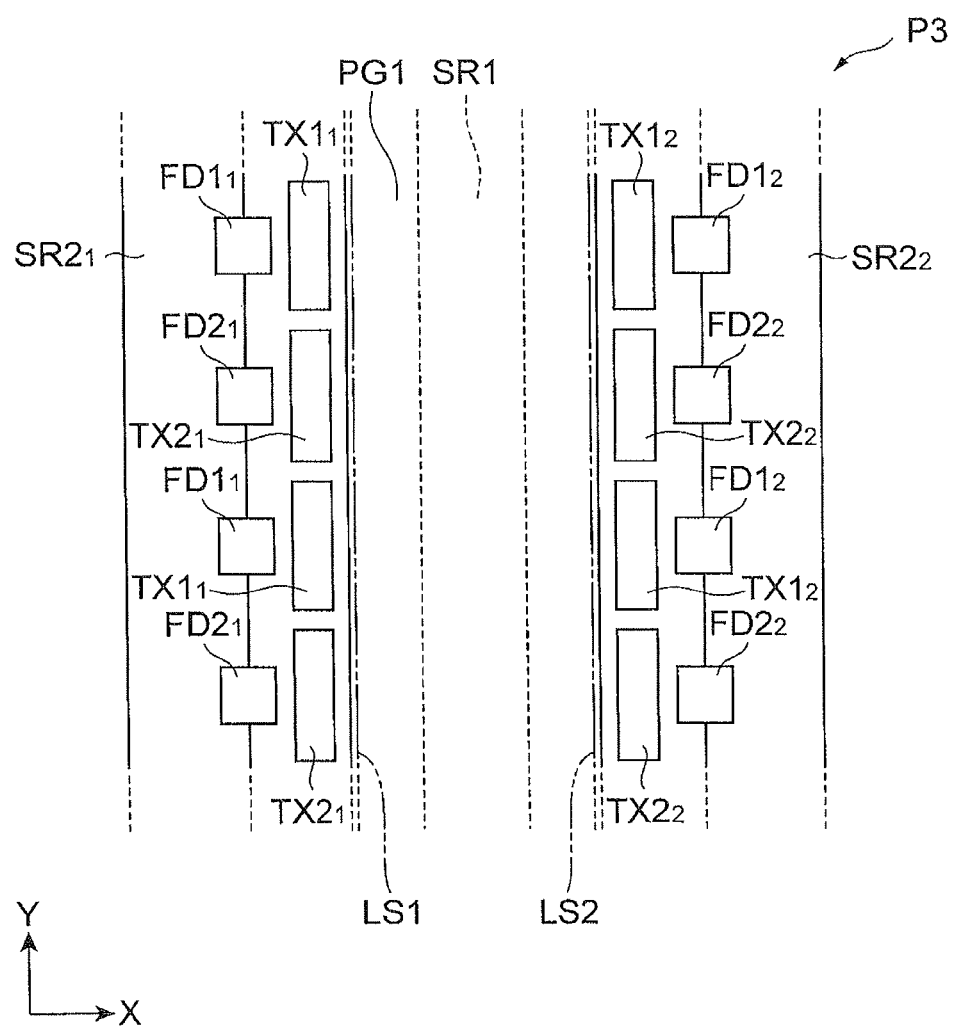
FIG. 13 is a plan view that illustrates a part of a distance sensor according to further another embodiment.

Subsequently, the configuration of a distance sensor according to further another embodiment will be described. FIG. 13 is a plan view that illustrates a part of the distance sensor according to further another embodiment.

As illustrated in FIG. 13, a distance sensor P3 according to this embodiment differs in that it does not include the third semiconductor regions $FD3_1$ and $FD3_2$ and the third gate electrodes $TX3_1$ and $TX3_2$, compared to the above-described distance sensor P1 (see FIG. 4)

In the distance sensor P3 according to this embodiment, since inclination of the potential is formed from the area right below the fourth semiconductor region SR1 toward the first longer side LS1 and the second longer side LS2, the transfer speed can be improved.

Since the fourth semiconductor region SR1 that is a potential adjusting means is shared by the area right below the portion of the photo gate electrode PG1 on the side of the first longer side LS1 and the area right below the portion of the photo gate electrode PG1 on the side of the second longer side LS2, the use efficiency of the area is improved. Accordingly, the aperture ratio can be improved.

Since the charge transfer signals $S_1$ and $S_2$ having mutually-differing phases are input to the plurality of first-side transfer electrodes ($TX1_1$ and $TX2_1$), and the charge transfer signals $S_1$ and $S_2$ having the mutually-differing phases are also input to the plurality of second-side transfer electrodes ($TX1_2$ and $TX2_2$), a failure in collection of the signal charge decreases, and the influence of manufacturing variations in the X direction is reduced. Accordingly, the transfer precision can be improved.

Since the light receiving area includes the first area and the second area, and the potential adjusting means is the fourth semiconductor region SR1 having high impurity concentration arranged between the first area and the second area, high potential can be generated using a simple configuration.

Figure 14:
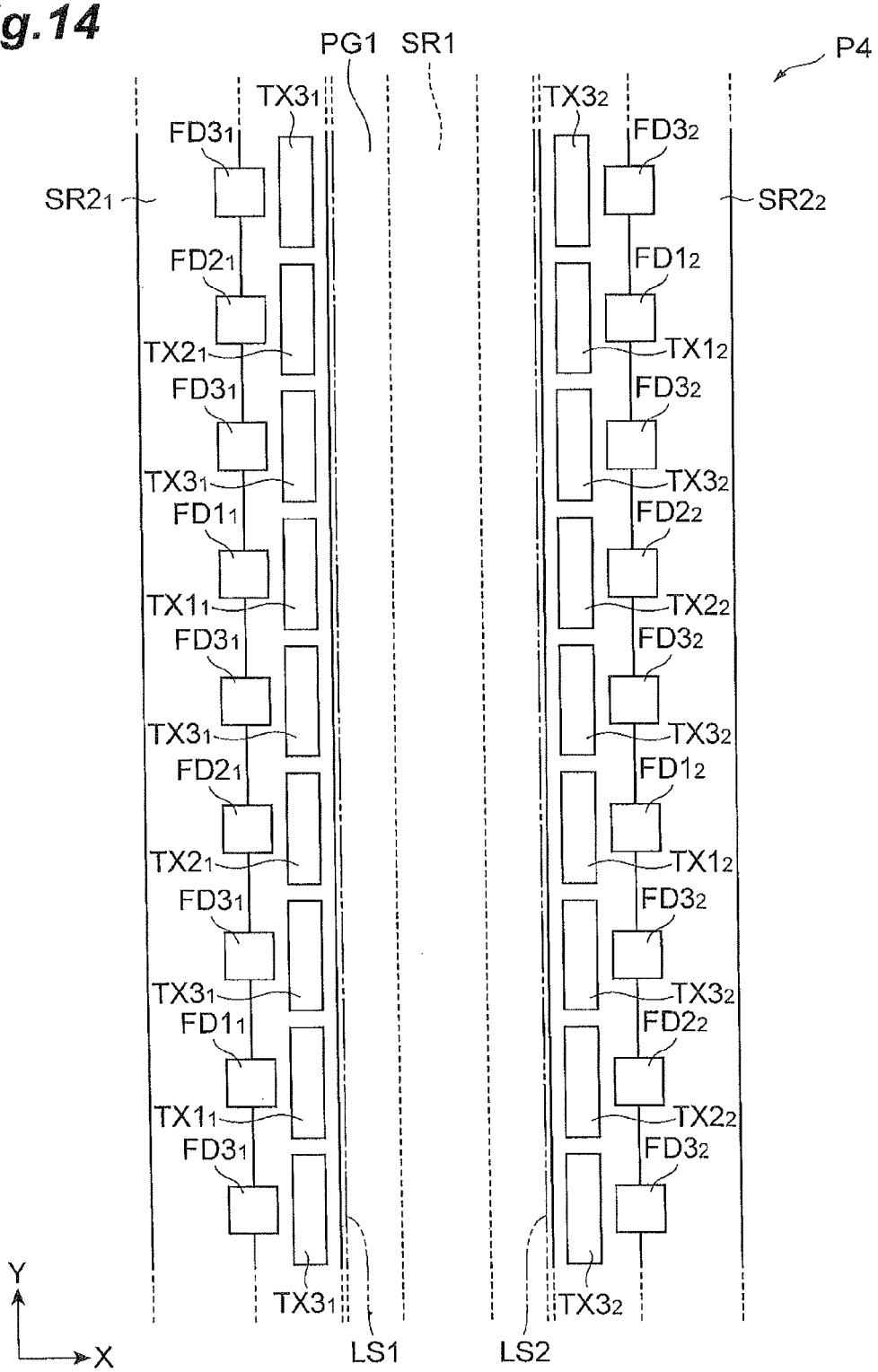
FIG. 14 is a plan view that illustrates a part of a distance sensor according to further another embodiment.

Subsequently, the configuration of a distance sensor according to further another embodiment will be described. FIG. 14 is a plan view that illustrates a part of a distance sensor according to further another embodiment.

As illustrated in FIG. 14, a distance sensor P4 according to this embodiment differs in that the arrangement of the semiconductor regions and the electrodes are different between the side of the first longer side LS1 and the side of the second longer side LS2, compared to the above-described distance sensor P1 (see FIG. 4).

In the distance sensor P4, the first gate electrode $TX1_1$ and the second gate electrode $TX2_2$ to which charge transfer signals having mutually-differing phases are applied face each other in the X direction, and the second gate electrode $TX2_1$ and the first gate electrode $TX1_2$ to which the charge transfer signals having mutually-differing phases are applied face each other in the X direction. Accordingly, the input positions of the detection gate signals $S_1$ and $S_2$ are different between the side of the first longer side LS1 and the side of the second longer side LS2. The first semiconductor region $FD1_1$ and the second semiconductor region $FD2_2$ face each other in the X direction, and the second semiconductor region $FD2_1$ and the first semiconductor region $FD1_2$ face each other in the X direction.

In the distance sensor P4 according to this embodiment, since inclination of the potential is formed from the area right below the fourth semiconductor region SR1 toward the first longer side LS1 and the second longer side LS2, the transfer speed can be improved.

Since the fourth semiconductor region SR1 that is a potential adjusting means is shared by the area right below the portion of the photo gate electrode PG1 on the side of the first longer side LS1 and the area right below the portion of the photo gate electrode PG1 on the side of the second longer side LS2, the use efficiency of the area is improved. Accordingly, the aperture ratio can be improved.

Since the charge transfer signals $S_1$ and $S_2$ having mutually-differing phases are input to the plurality of first-side transfer electrodes ($TX1_1$ and $TX2_1$), and the charge transfer signals $S_1$ and $S_2$ having the mutually-differing phases are also input to the plurality of second-side transfer electrodes ($TX1_2$ and $TX2_2$), a failure in collection of the signal charge decreases, and the influence of manufacturing variations in the X direction is reduced. Accordingly, the transfer precision can be improved.

The gate electrodes are arranged such that the first gate electrode $TX1_1$ and the second gate electrode $TX2_2$ to which charge transfer signals having mutually-differing phases are applied face each other in the X direction, and the second gate electrode $TX2_1$ and the first gate electrode $TX1_2$ to which charge transfer signals having mutually-differing phases are applied face each other in the X direction. Accordingly, input positions of the detection gate signals having the same phase are different between the side of the first longer side LS1 and the side of the second longer side LS2. For this reason, the dependence on the input positions of the detection gate signals can be offset. Accordingly, the transfer precision can be improved.

Since the distance sensor P4 includes the third semiconductor regions $FD3_1$ and $FD3_2$ and the third gate electrodes $TX3_1$ and $TX3_2$ on the side of the first longer side LS1 and the side of the second longer side LS2, respectively, unnecessary electric charge can be discharged. Accordingly, the transfer precision can be improved.

Since the light receiving area includes the first area and the second area, and the potential adjusting means is the fourth semiconductor region SR1 having high impurity concentration arranged between the first area and the second area, high potential can be generated using a simple configuration.

Figure 15:
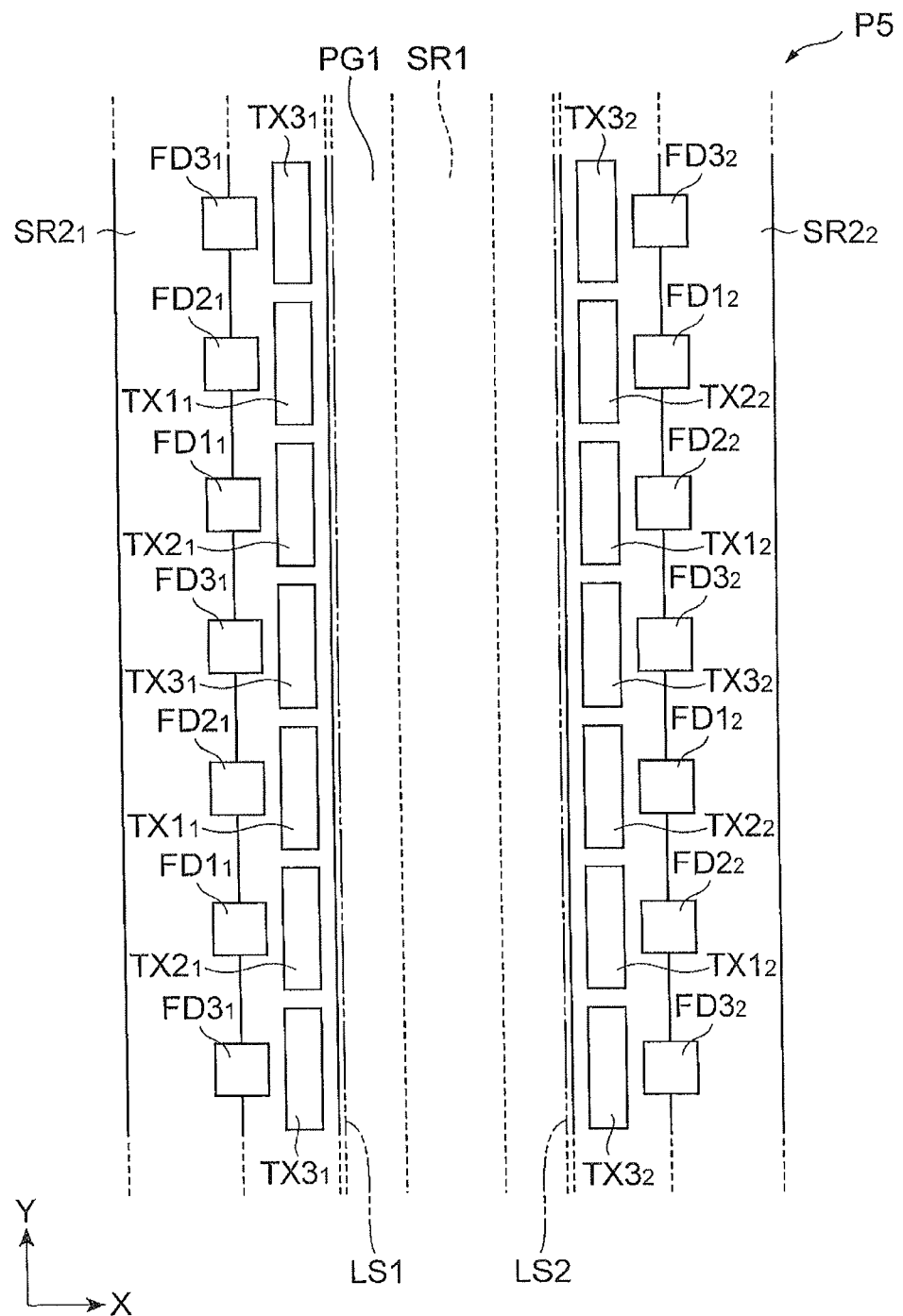
FIG. 15 is a plan view that illustrates a part of a distance sensor according to further another embodiment.

Subsequently, the configuration of a distance sensor according to further another embodiment will be described. FIG. 15 is a plan view that illustrates a part of the distance sensor according to further another embodiment.

As illustrated in FIG. 15, a distance sensor P5 according to this embodiment differs in that the arrangement of the semiconductor regions and the electrodes are different between the side of the first longer side LS1 and the side of the second longer side LS2, compared to the above-described distance sensor P2 (see FIG. 12).

In the distance sensor P5, the first gate electrode $TX1_1$ and the second gate electrode $TX2_2$ to which charge transfer signals having mutually-differing phases are applied face each other in the X direction, and the second gate electrode $TX2_1$ and the first gate electrode $TX1_2$ to which the charge transfer signals having mutually-differing phases are applied face each other in the X direction. Accordingly, the input positions of the detection gate signals $S_1$ and $S_2$ are different between the side of the first longer side LS1 and the side of the second longer side LS2. The first semiconductor region $FD1_1$ and the second semiconductor region $FD2_2$ face each other in the X direction, and the second semiconductor region $FD2_1$ and the first semiconductor region $FD1_2$ face each other in the X direction.

In the distance sensor P5 according to this embodiment, since inclination of the potential is formed from the area right below the fourth semiconductor region SR1 toward the first longer side LS1 and the second longer side LS2, the transfer speed can be improved.

Since the fourth semiconductor region SR1 that is a potential adjusting means is shared by the area right below the portion of the photo gate electrode PG1 on the side of the first longer side LS1 and the area right below the portion of the photo gate electrode PG1 on the side of the second longer side LS2, the use efficiency of the area is improved. Accordingly, the aperture ratio can be improved.

Since the charge transfer signals $S_1$ and $S_2$ having mutually-differing phases are input to the plurality of first-side transfer electrodes ($TX1_1$ and $TX2_1$), and the charge transfer signals $S_1$ and $S_2$ having the mutually-differing phases are also input to the plurality of second-side transfer electrodes ($TX1_2$ and $TX2_2$), a failure in collection of the signal charge decreases, and the influence of manufacturing variations in the X direction is reduced. Accordingly, the transfer precision can be improved.

The gate electrodes are arranged such that the first gate electrode $TX1_1$ and the second gate electrode $TX2_2$ to which charge transfer signals having mutually-differing phases are applied face each other in the X direction, and the second gate electrode $TX2_1$ and the first gate electrode $TX1_2$ to which charge transfer signals having mutually-differing phases are applied face each other in the X direction. Accordingly, input positions of the detection gate signals having the same phase are different between the side of the first longer side LS1 and the side of the second longer side LS2. For this reason, the dependence on the input positions of the detection gate signals can be offset. Accordingly, the transfer precision can be improved.

Since the light receiving area includes the first area and the second area, and the potential adjusting means is the fourth semiconductor region SR1 having high impurity concentration arranged between the first area and the second area, high potential can be generated using a simple configuration.

Figure 16:
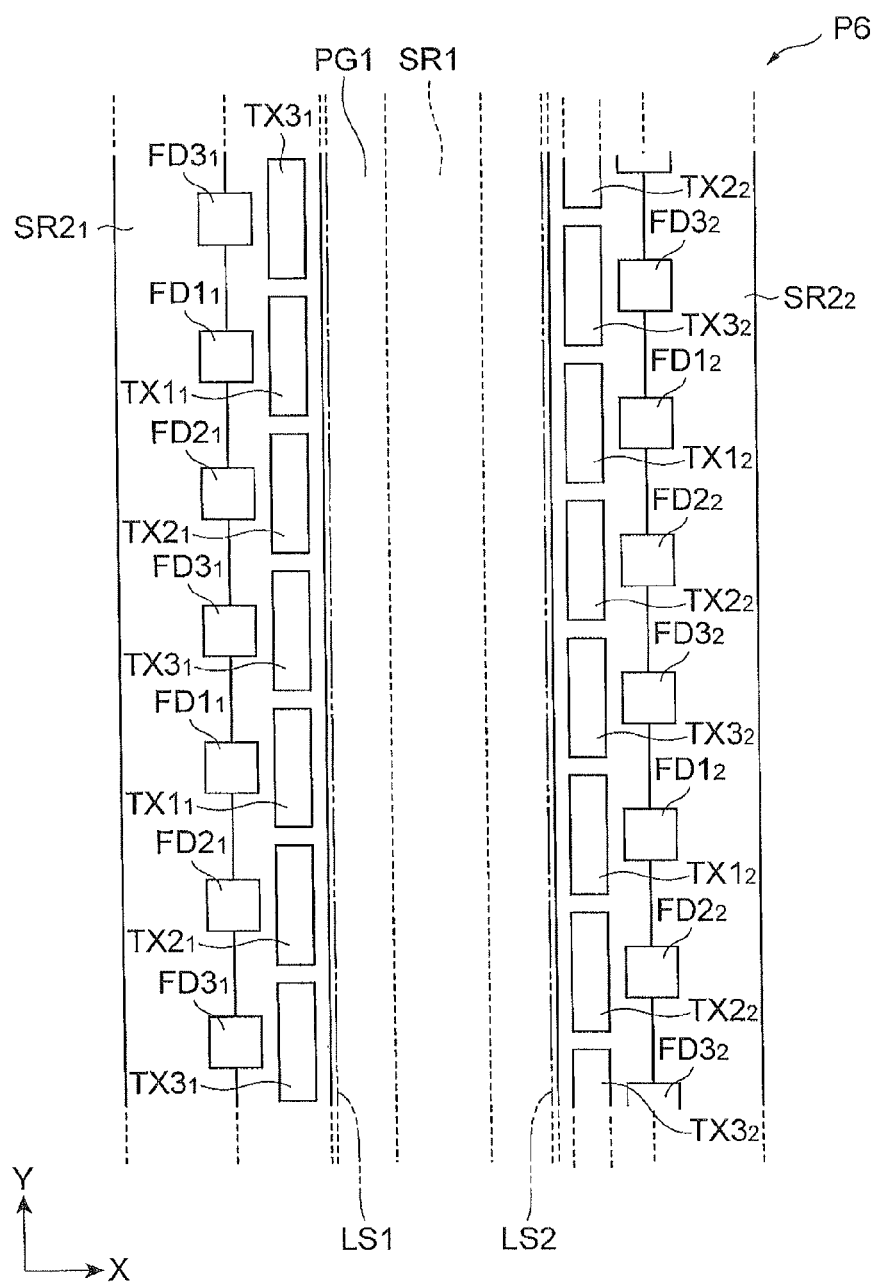
FIG. 16 is a plan view that illustrates a part of a distance sensor according to further another embodiment.

Subsequently, the configuration of a distance sensor according to further another embodiment will be described. FIG. 16 is a plan view that illustrates a part of the distance sensor according to further another embodiment.

As illustrated in FIG. 16, a distance sensor P6 according to this embodiment differs in that the positions of the semiconductor regions and the electrodes deviate between the side of the first longer side LS1 and the second longer side LS2, compared to the above-described distance sensor P2 (see FIG. 12).

In the distance sensor P6, the positions of the first and second gate electrodes $TX1_1$ and $TX2_1$ on the side of the first longer side LS1 and the first and second gate electrodes $TX1_2$ and $TX2_2$ on the side of the second longer side LS2 are arranged to be deviated with each other in the Y direction. Accordingly, the input positions of the detection gate signals $S_1$ and $S_2$ are different between the side of the first longer side LS1 and the side of the second longer side LS2. The positions of the first and second semiconductor regions $FD1_1$ and $FD2_1$ on the side of the first longer side LS1 and the first and second semiconductor regions $FD1_2$ and $FD2_2$ on the side of the second longer side LS2 are arranged to be deviated with each other in the Y direction.

In the distance sensor P6 according to this embodiment, since inclination of the potential is formed from the area right below the fourth semiconductor region SR1 toward the first longer side LS1 and the second longer side LS2, the transfer speed can be improved.

Since the fourth semiconductor region SRI that is a potential adjusting means is shared by the area right below the portion of the photo gate electrode PG1 on the side of the first longer side LS1 and the area right below the portion of the photo gate electrode PG1 on the side of the second longer side LS2, the use efficiency of the area is improved. Accordingly, the aperture ratio can be improved.

Since the charge transfer signals $S_1$ and $S_2$ having mutually-differing phases are input to the plurality of first-side transfer electrodes ($TX1_1$ and $TX2_1$), and the charge transfer signals $S_1$ and $S_2$ having the mutually-differing phases are also input to the plurality of second-side transfer electrodes ($TX1_2$ and $TX2_2$), a failure in collection of the signal charge decreases, and the influence of manufacturing variations in the X direction is reduced. Accordingly, the transfer precision can be improved.

Since the first and second gate electrodes $TX1_1$ and $TX2_1$ on the side of the first longer side LS1 and the first and second gate electrodes $TX1_2$ and $TX2_2$ on the side of the second longer side LS2 are arranged to have positions deviating from each other in the Y direction in which the first and second longer sides LS1 and LS2 extend, the input positions of the charge transfer signals having the same phase are different between the side of the first longer side LS1 and the side of the second longer side LS2. For this reason, the dependence on the input positions of the charge transfer signals can be offset. Accordingly, the transfer precision can be improved.

Since the distance sensor P6 includes the third semiconductor regions $FD3_1$ and $FD3_2$ and the third gate electrodes $TX3_1$ and $TX3_2$ on the side of the first longer side LS1 and the side of the second longer side LS2, respectively, unnecessary electric charge can be discharged. Accordingly, the transfer precision can be improved.

Since the light receiving area includes the first area and the second area, and the potential adjusting means is the fourth semiconductor region SR1 having high impurity concentration arranged between the first area and the second area, high potential can be generated using a simple configuration.

Figure 17:
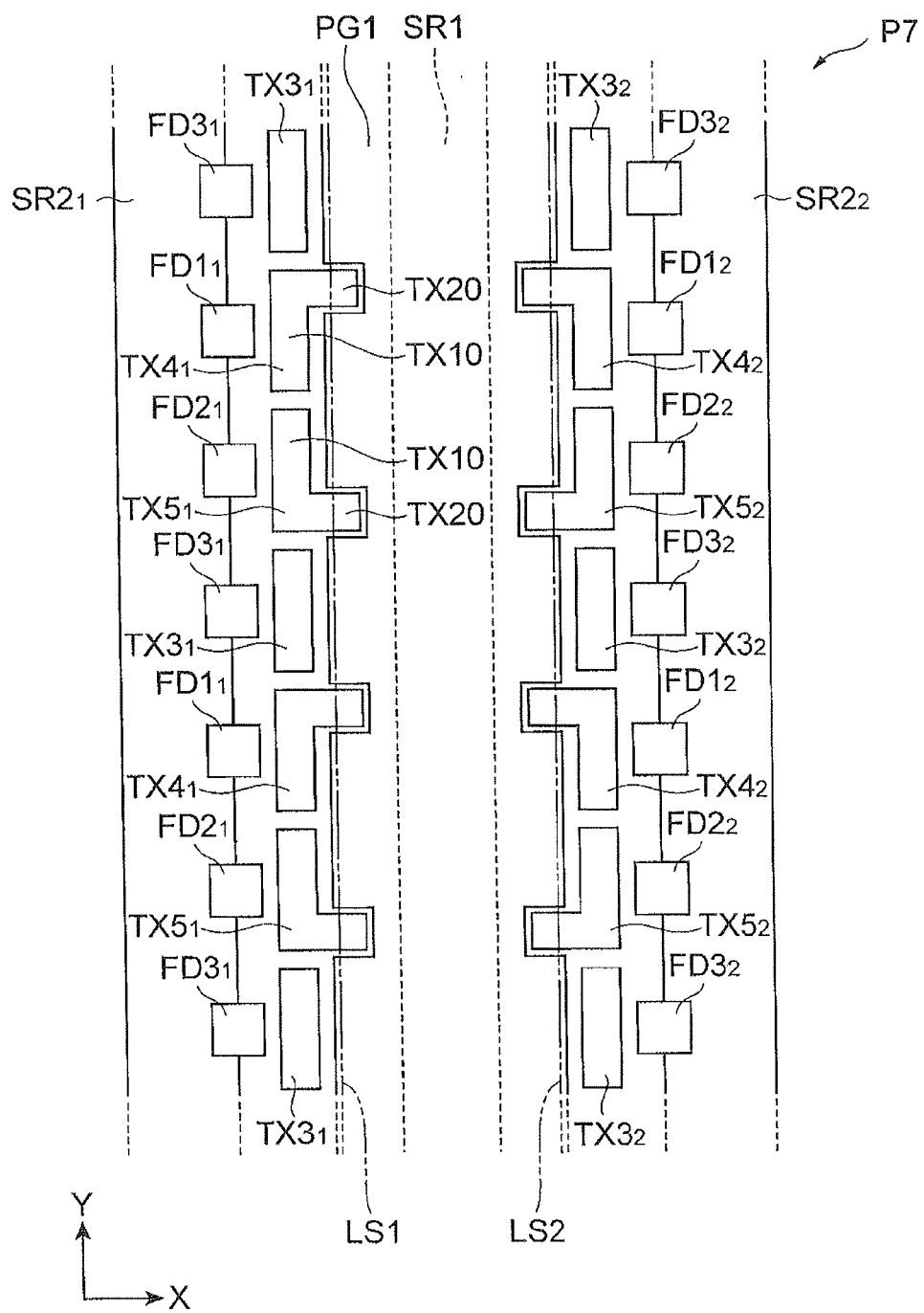
FIG. 17 is a plan view that illustrates a part of a distance sensor according to further another embodiment.

Subsequently, the configuration of a distance sensor according to further another embodiment will be described. FIG. 17 is a plan view that illustrates a part of the distance sensor according to further another embodiment.

As illustrated in FIG. 17, a distance sensor P7 according to this embodiment differs in that fourth gate electrodes $TX4_1$ and $TX4_2$ having a shape different from that of the first gate electrodes $TX1_1$ and $TX1_2$ are included instead of the first gate electrodes $TX1_1$ and $TX1_2$, and fifth gate electrodes $TX5_1$ and $TX5_2$ having a shape different from that of the second gate electrodes $TX2_1$ and $TX2_2$ are included instead of the second gate electrodes $TX2_1$ and $TX2_2$, compared to the above-described distance sensor P2 (see FIG. 12).

On the side of the first longer side LS1, a plurality of pairs of the fourth gate electrode $TX4_1$ and the fifth gate electrode $TX5_1$ adjacent to each other in the Y direction are formed in the Y direction, and, on the side of the longer side LS2, a plurality of pairs of the fourth gate electrode $TX4_2$ and the fifth gate electrode $TX5_2$ adjacent to each other in the Y direction are formed in the Y direction. Between the pairs on the side of the first longer side LS1, the third gate electrode $TX3_1$ is arranged, and, between the pairs on the side of the second longer side LS2, the third gate electrode $TX3_2$ is arranged.

Each of the fourth and fifth gate electrodes $TX4_1$ to $TX5_2$ shows an "L" shape in the plan view. Each of the fourth and fifth gate electrodes $TX4_1$ to $TX5_2$ includes a first portion TX10 and a second portion TX20. The first portion TX10 extends in the Y direction and shows a rectangular shape having the Y direction as its longer-side direction in the plan view. The second portion TX20 extends in the X direction from an end portion of the first portion TX10 positioned farther from the adjacent first portion TX10 and shows a rectangular shape having the X direction as its longer-side direction in the plan view. The second portion TX20 includes a portion overlapping the light receiving area in the plan view.

The photo gate electrode PG1 shows a shape having recessed portions so as to avoid the fourth and fifth gate electrodes $TX4_1$ to $TX5_2$ for each longer side in the plan view. The second portion TX20 is surrounded by the photo gate electrode PG1 in the plan view. More specifically, the second portion TX20 is surrounded by the photo gate electrode PG1 over three sides included in the edge of the second portion TX20.

As described above, in the light receiving area of the semiconductor substrate 1A, the area corresponding to the photo gate electrode PG1 (the area right below the photo gate electrode PG1) serves as an electric charge generation region in which electric charge is generated according to incident light. Since the fourth and fifth gate electrodes $TX4_1$ to $TX5_2$ are formed using polysilicon, light is transmitted through the second portions TX20 of the fourth and fifth gate electrodes $TX4_1$ to $TX5_2$ and is incident to the semiconductor substrate 1A. Accordingly, an area of the semiconductor substrate 1A right below the second portion TX20 also serves as an electric charge generation region. Thus, in this embodiment, in the plan view, the shape of the light receiving area and the shape of the electric charge generation region coincide with each other. The second portion TX20 is positioned to overlap also the electric charge generation region. In a case where the fourth and fifth gate electrodes $TX4_1$ to $TX5_2$ are formed using a material not transmitting light, the electric charge generation region is defined by the photo gate electrode PG1, and the shape of the light receiving area and the shape of the electric charge generation region do not coincide with each other.

In the distance sensor P7 according to this embodiment, since inclination of the potential is formed from the area right below the fourth semiconductor region SR1 toward the first longer side LS1 and the second longer side LS2, the transfer speed can be improved.

Since the fourth semiconductor region SR1 that is a potential adjusting means is shared by the area right below the portion of the photo gate electrode PG1 on the side of the first longer side LS1 and the area right below the portion of the photo gate electrode PG1 on the side of the second longer side LS2, the use efficiency of the area is improved. Accordingly, the aperture ratio can be improved.

Since the charge transfer signals $S_1$ and $S_2$ having mutually-differing phases are input to the plurality of first-side transfer electrodes ($TX4_1$ and $TX5_1$), and the charge transfer signals $S_1$ and $S_2$ having the mutually-differing phases are also input to the plurality of second-side transfer electrodes ($TX4_2$ and $TX5_2$), a failure in collection of the signal charge decreases, and the influence of manufacturing variations in the X direction is reduced. Accordingly, the transfer precision can be improved.

Since the distance sensor P7 includes the third semiconductor regions $FD3_1$ and $FD3_2$ and the third gate electrodes $TX3_1$ and $TX3_2$ on the side of the first longer side LS1 and the side of the second longer side LS2, respectively, unnecessary electric charge can be discharged. Accordingly, the transfer precision can be improved.

Since the light receiving area includes the first area and the second area, and the potential adjusting means is the fourth semiconductor region SR1 having high impurity concentration arranged between the first area and the second area, high potential can be generated using a simple configuration.

A plurality of transfer electrodes on the side of the first longer side LS1 includes pairs of the fourth gate electrode $TX4_1$ and the fifth gate electrode $TX5_1$, to which signals having mutually-differing phases are applied, adjacent to each other in the Y direction, and a plurality of transfer electrodes on the side of the longer side LS2 includes pairs of the fourth gate electrode $TX4_2$ and the fifth gate electrode $TX5_2$, to which signals having mutually-differing phases are applied, adjacent to each other in the Y direction. Each of the fourth and fifth gate electrodes $TX4_1$ to $TX5_2$ includes the first portion TX10 extending along the Y direction and the second portion TX20 extending to overlap the light receiving area from the end portion of the first portion TX10 that is disposed farther from the adjacent first portion TX10. When signal charge is transferred, in an area right below the transfer electrode that does not transfer the signal charge out of the pair of transfer electrodes, the potential can be raised. Thus, in the light receiving area, inclination of the potential from the area right below the second portion TX20 of the transfer electrode, which does not transfer signal charge, along the Y direction occurs, and the signal charge speedily moves in the Y direction. Accordingly, the transfer speed can be improved. Particularly, for a configuration that is long in the Y direction, similar to the distance sensor P7, the advantages of this embodiment can be appropriately acquired.

Figure 18:
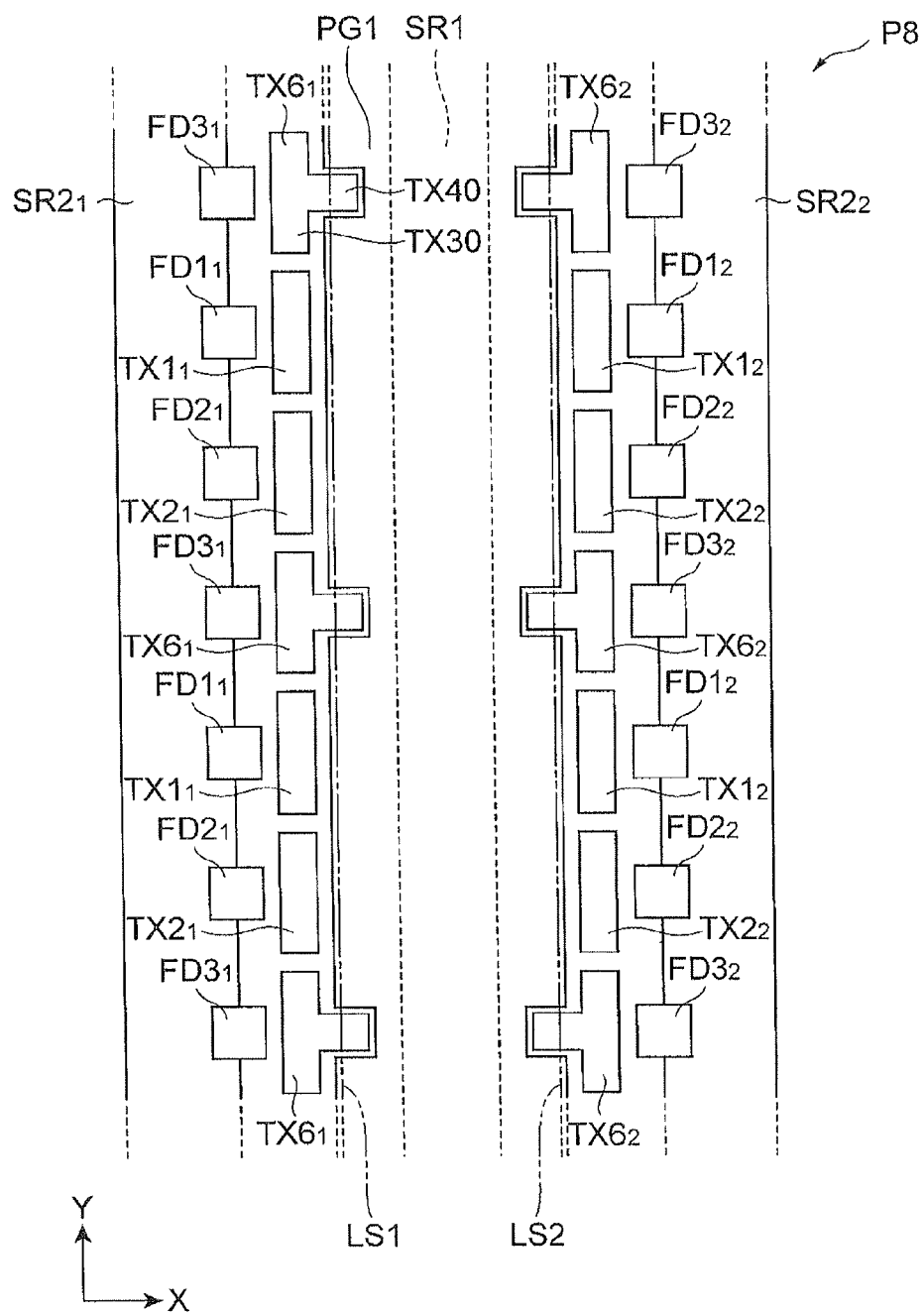
FIG. 18 is a plan view that illustrates a part of a distance sensor according to further another embodiment.

Subsequently, the configuration of a distance sensor according to further another embodiment will be described. FIG. 18 is a plan view that illustrates a part of the distance sensor according to further another embodiment.

As illustrated in FIG. 18, a distance sensor P8 according to this embodiment differs in that sixth gate electrodes $TX6_1$ and $TX6_2$ having a shape different from that of the third gate electrodes $TX3_1$ and $TX3_2$ are included instead of the third gate electrodes $TX3_1$ and $TX3_2$, compared to the above-described distance sensor P2 (see FIG. 12).

Each of the sixth gate electrodes $TX6_1$ and $TX6_2$ shows a "T" shape in the plan view. Each of the sixth gate electrodes $TX6_1$ and $TX6_2$ includes a third portion TX30 and a fourth portion TX40. The third portion TX30 extends in the Y direction and shows a rectangular shape having the Y direction as its longer-side direction in the plan view. The fourth portion TX40 extends from the Y-direction center portion of the third portion TX30 in the X direction and shows a rectangular shape having the X direction as its longer-side direction in the plan view. The fourth portion TX40 has a portion overlapping the light receiving area in the plan view.

The photo gate electrode PG1 shows a shape having recessed portions so as to avoid the fourth portions TX40 of the sixth gate electrodes $TX6_1$ to $TX6_2$ for each longer side in the plan view. The fourth portion TX40 is surrounded by the photo gate electrode PG1 in the plan view. More specifically, the fourth portion TX40 is surrounded by the photo gate electrode PG1 over three sides included in the edge of the fourth portion TX40.

As described above, in the light receiving area of the semiconductor substrate 1A, the area corresponding to the photo gate electrode PG1 (the area right below the photo gate electrode PG1) serves as an electric charge generation region in which electric charge is generated according to incident light. Since the sixth gate electrodes $TX6_1$ and $TX6_2$ are formed using polysilicon, light is transmitted through the fourth portions TX40 of the sixth gate electrodes $TX6_1$ and $TX6_2$ and is incident to the semiconductor substrate 1A. Accordingly, an area of the semiconductor substrate 1A right below the fourth portion TX40 also serves as an electric charge generation region. Thus, in this embodiment, in the plan view, the shape of the light receiving area and the shape of the electric charge generation region coincide with each other. The fourth portion TX40 is positioned to overlap also the electric charge generation region. In a case where the sixth gate electrodes $TX6_1$ and $TX6_2$ are formed using a material not transmitting light, the electric charge generation region is defined by the photo gate electrode PG1, and the shape of the light receiving area and the shape of the electric charge generation region do not coincide with each other.

In the distance sensor P8 according to this embodiment, since inclination of the potential is formed from the area right below the fourth semiconductor region SR1 toward the first longer side LS1 and the second longer side LS2, the transfer speed can be improved.

Since the fourth semiconductor region SR1 that is a potential adjusting means is shared by the area right below the portion of the photo gate electrode PG1 on the side of the first longer side LS1 and the area right below the portion of the photo gate electrode PG1 on the side of the second longer side LS2, the use efficiency of the area is improved. Accordingly, the aperture ratio can be improved.

Since the charge transfer signals $S_1$ and $S_2$ having mutually-differing phases are input to the plurality of first-side transfer electrodes ($TX1_1$ and $TX2_1$), and the charge transfer signals $S_1$ and $S_2$ having the mutually-differing phases are also input to the plurality of second-side transfer electrodes ($TX1_2$ and $TX2_2$), a failure in collection of the signal charge decreases, and the influence of manufacturing variations in the X direction is reduced. Accordingly, the transfer precision can be improved.

Since the distance sensor P8 includes the third semiconductor regions $FD3_1$ and $FD3_2$ and the sixth gate electrodes $TX6_1$ and $TX6_2$ on the side of the first longer side LS1 and the side of the second longer side LS2, respectively, unnecessary electric charge can be discharged. Accordingly, the transfer precision can be improved.

Each of the sixth gate electrodes $TX6_1$ and $TX6_2$ includes the third portion TX30 that extends in the Y direction in which the first and second longer sides LS1 and LS2 extend and the fourth portion TX40 that extends from the third portion TX30 so as to overlap the light receiving area. When signal charge is transferred, in areas right below the sixth gate electrodes $TX6_1$ and $TX6_2$, the potential can be raised. Accordingly, in the light receiving area, inclination of the potential occurs along the Y direction from the areas right below the fourth portions TX40 of the sixth gate electrodes $TX6_1$ and $TX6_2$ toward the periphery thereof, and the signal charge speedily moves in the Y direction. Accordingly, the transfer speed can be improved. Particularly, for a configuration that is long in the Y direction, similar to the distance sensor P8, the advantages of this embodiment are appropriately acquired.

Since the light receiving area includes the first area and the second area, and the potential adjusting means is the fourth semiconductor region SRI having high impurity concentration arranged between the first area and the second area, high potential can be generated using a simple configuration.

Figure 19:
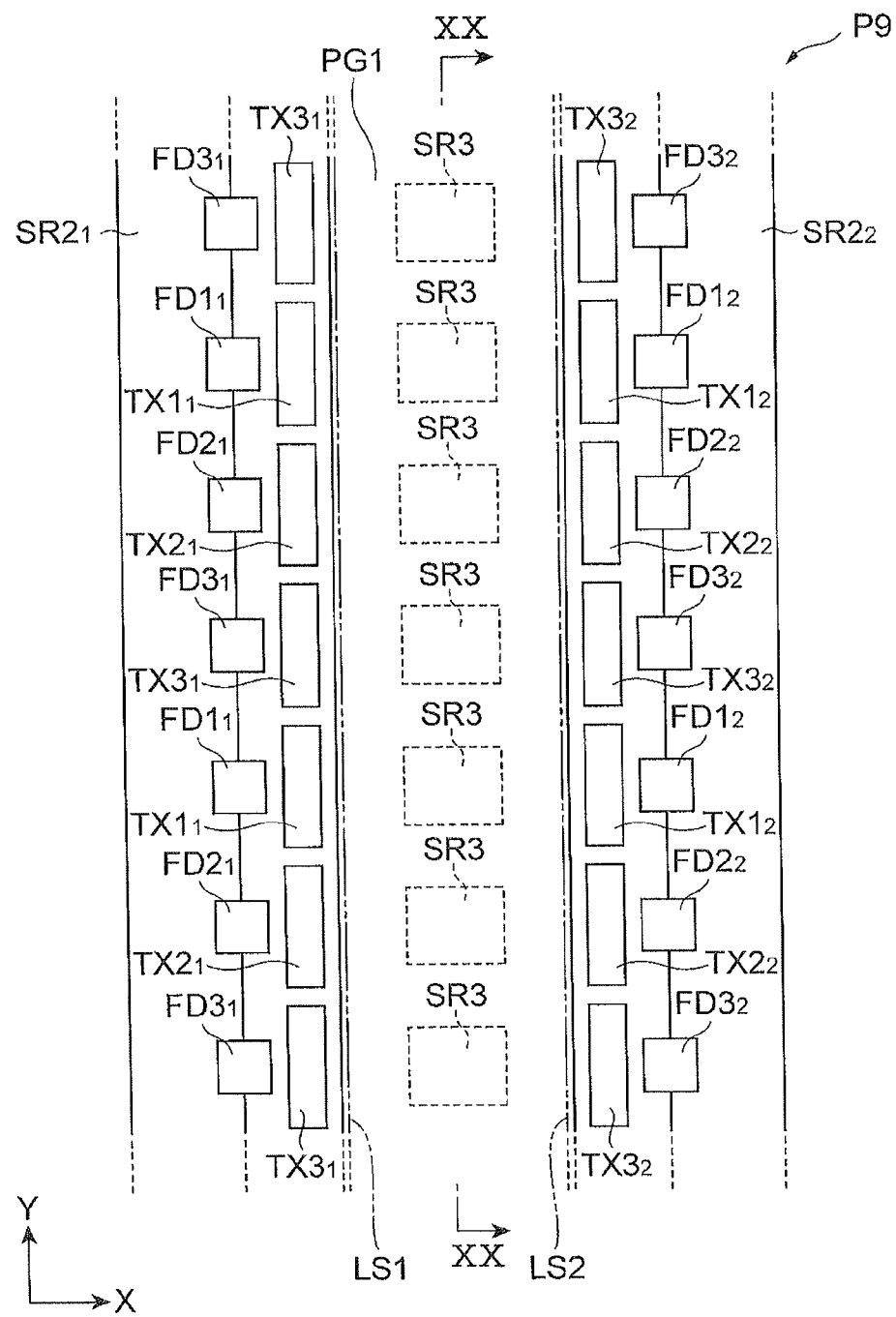
FIG. 19 is a plan view that illustrates a part of a distance sensor according to further another embodiment.

Subsequently, the configuration of a distance sensor according to further another embodiment will be described. FIG. 19 is a plan view that illustrates a part of the distance sensor according to further another embodiment.

As illustrated in FIG. 19, a distance sensor P9 according to this embodiment differs in that it includes a sixth semiconductor region SR3 of which the configuration is different from that of the fourth semiconductor region SR1 instead of the fourth semiconductor region SR1, compared to the above-described distance sensor P2 (see FIG. 12).

A plurality of sixth semiconductor regions SR3 are arranged to be separate from each other in the Y direction between the first area on the side of the first longer side LS1 and the second area on the side of the second longer side LS2 in the light receiving area. The sixth semiconductor region SR3 shows a rectangular shape (more specifically, a rectangular shape having the X direction as its longer-side direction) in the plan view. In the Y direction, between the sixth semiconductor regions SR3 and SR3, the first area and the second area of the light receiving area are connected.

Figure 20:
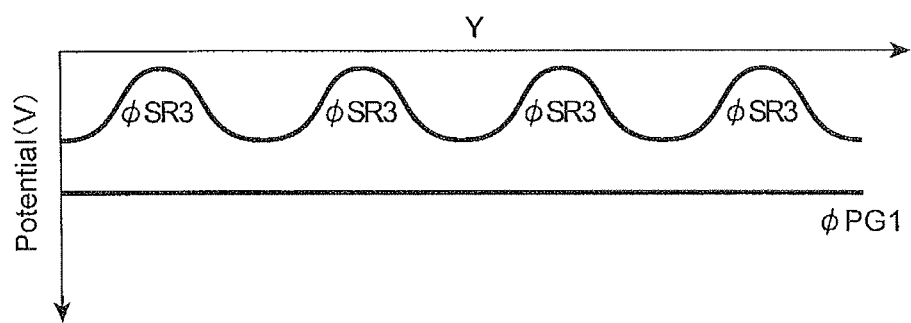
FIG. 20 is a diagram that illustrates a potential distribution on a cross-section taken along line XX-XX illustrated in FIG. 19.

FIG. 20 is a diagram that illustrates a potential distribution on a cross-section taken along line XX-XX illustrated in FIG. 19. In the area right below the photo gate electrode PG1, the potential of the center portion in the X direction is potential φSR3 in the areas right below the sixth semiconductor regions SR3 and is higher than the potential φPG1 of the side of the first longer side LS1 and the side of the second longer side LS2. In addition, the potential between the sixth semiconductor regions SR3 and SR3 is higher than the potential φPG1 of the side of the first longer side LS1 and the side of the second longer side LS2 due to the influence of the potential φSR3 of the area right below the sixth semiconductor region SR1 Accordingly, in the area right below the photo gate electrode PG1, a high potential area extending in the Y direction is formed between the first longer side LS1 and the second longer side LS2, and a much steeper gradient of the potential decreasing from the area right below the sixth semiconductor region SR3 toward the first longer side LS1 and the second longer side LS2 is formed.

In the distance sensor P9 according to this embodiment, since inclination of the potential is formed from the high potential area including the sixth semiconductor regions SR3 toward the first longer side LS1 and the second longer side LS2, the transfer speed can be improved.

Since the sixth semiconductor region SR3 that is a potential adjusting means is shared by the area right below the portion of the photo gate electrode PG1 on the side of the first longer side LS1 and the area right below of the portion of the photo gate electrode PG1 on the side of the second longer side LS2, the use efficiency of the area is improved. Accordingly, the aperture ratio can be improved.

Since the charge transfer signals $S_1$ and $S_2$ having mutually-differing phases are input to the plurality of first-side transfer electrodes ($TX1_1$ and $TX2_1$), and the charge transfer signals $S_1$ and $S_2$ having the mutually-differing phases are also input to the plurality of second-side transfer electrodes ($TX1_2$ and $TX2_2$), a failure in collection of the signal charge decreases, and the influence of manufacturing variations in the X direction is reduced. Accordingly, the transfer precision can be improved.

Since the distance sensor P9 includes the third semiconductor regions $FD3_1$ and $FD3_2$ and the third gate electrodes $TX3_1$ and $TX3_2$ on the side of the first longer side LS1 and the side of the second longer side LS2, unnecessary electric charge can be discharged. Accordingly, the transfer precision can be improved.

Since the light receiving area includes the first area and the second area, and the potential adjusting means is the sixth semiconductor region SR3 having high impurity concentration arranged between the first area and the second area, high potential can be generated using a simple configuration.

Figure 21:
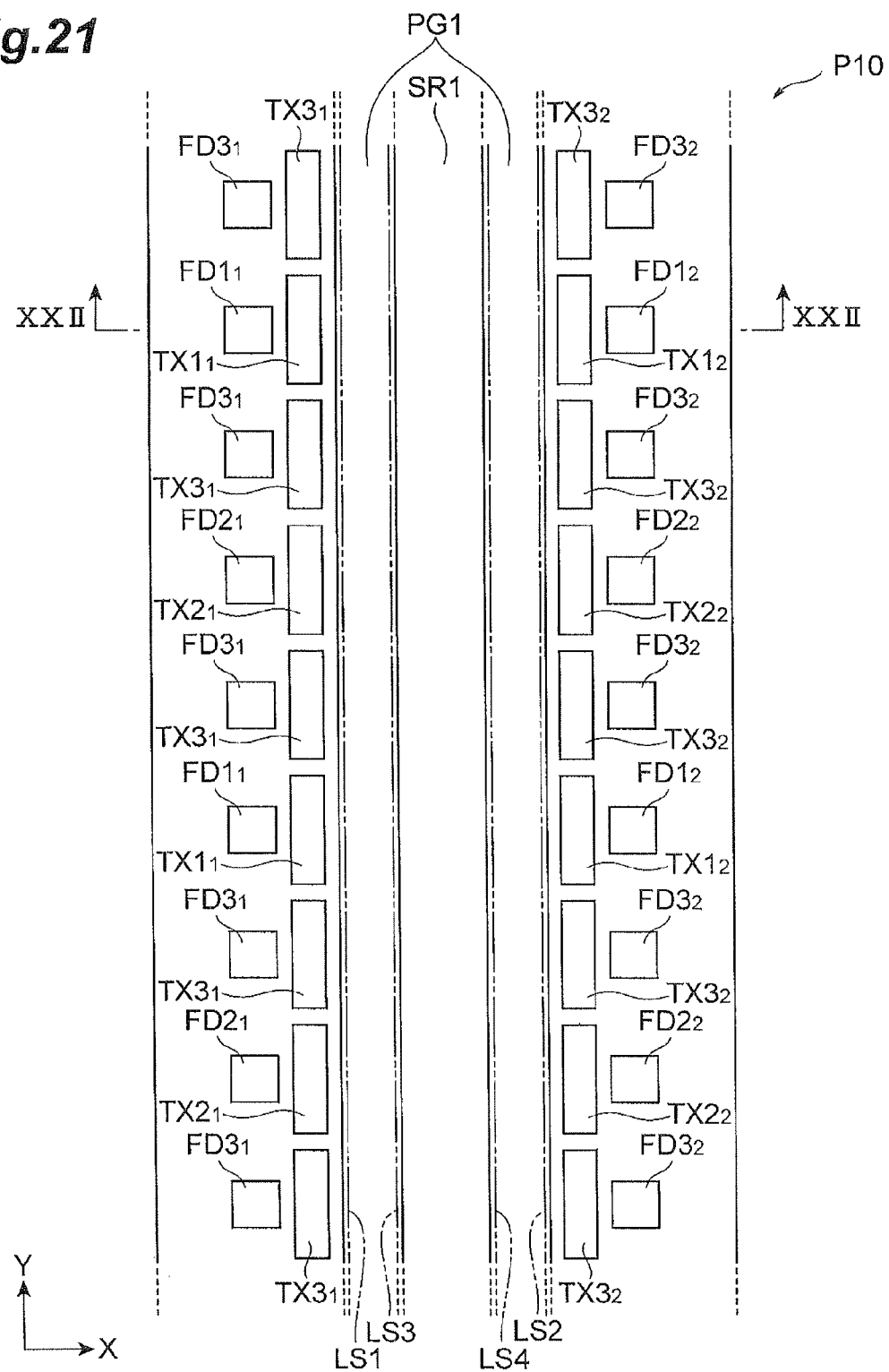
FIG. 21 is a plan view that illustrates a part of a distance sensor according to further another embodiment.
Figure 22:
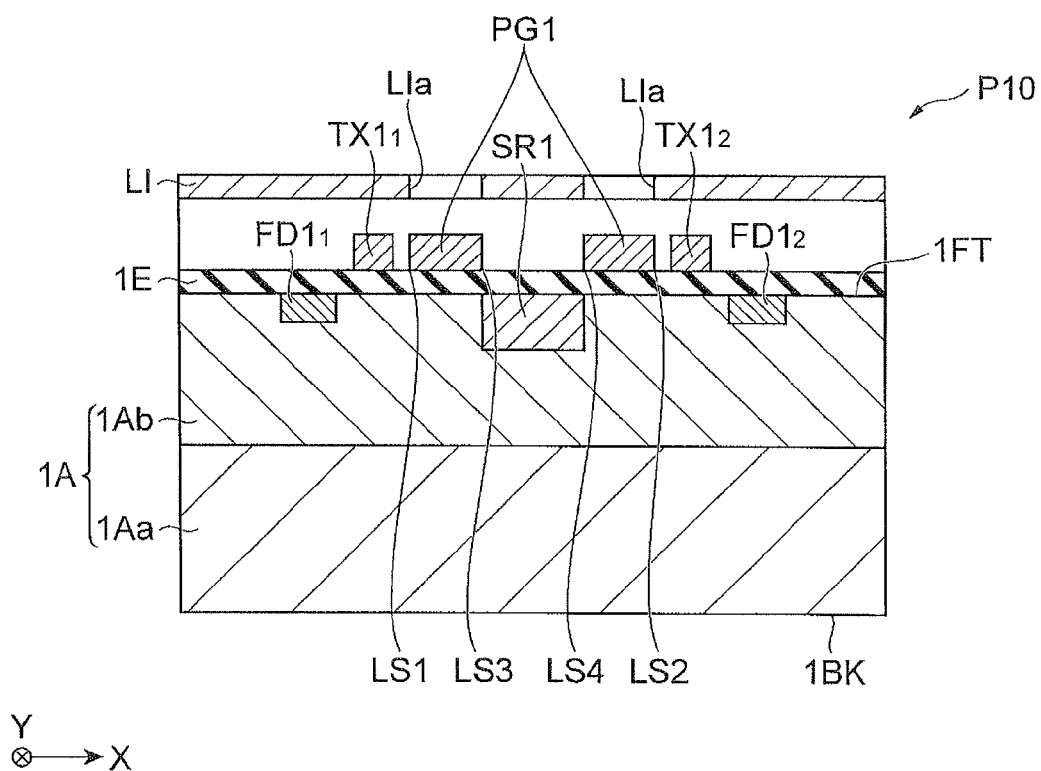
FIG. 22 is a cross-sectional view taken along line XXII-XXII illustrated in FIG. 21.

Subsequently, the configuration of a distance sensor according to further another embodiment will be described. FIG. 21 is a plan view that illustrates a part of the distance sensor according to further another embodiment. FIG. 22 is a cross-sectional view taken along line XXII-XXII illustrated in FIG. 21.

As illustrated in FIGS. 21 and 22, a distance sensor P10 according to this embodiment differs in the configuration of a light receiving area (the configuration of openings LIa of the light shielding layer LI) and the configuration of a photo gate electrode PG1, compared to the above-described distance sensor P1 (see FIG. 4).

In the distance sensor P10, two openings LIa of the light shielding layer LI are disposed to be separate from each other in the X direction such that the fourth semiconductor region SR1 is not included in the light receiving area. Each opening LIa shows a rectangular shape having the Y direction as its longer-side direction.

The light receiving area is defined by the two openings LIa on the semiconductor substrate 1A. The light receiving area corresponds to the shapes of the two openings LIa and is divided into two parts in the X direction. Each divided portion of the light receiving area shows a rectangular shape having the Y direction as its longer-side direction. A portion of the light receiving area on one side (the left side in FIGS. 21 and 22) includes first and third longer sides LS1 and LS3 that face each other in the X direction and extend in the Y direction. A portion of the light receiving area on the other side includes second and fourth longer sides LS2 and LS4 that face each other in the X direction and extend in the Y direction. The length of each of the first to fourth longer sides LS1 to LS4 is longer than a gap between the first longer side LS1 and the second longer side LS2.

The photo gate electrode PG1 is arranged in correspondence with the two openings LIa and is divided into two parts in the X direction. In other words, the photo gate electrode PG1 is not arranged on the fourth semiconductor region SR1. Each part of the divided photo gate electrode PG1 corresponds to the shape of the opening LIa and shows a rectangular shape having the Y direction as its longer-side direction.

In the distance sensor P10, the fifth semiconductor region SR2 is not disposed.

Also in the distance sensor P10, similar to the above-described distance sensor P1, the potential of the area right below the fourth semiconductor region SRI is higher than the potential of the side of the first longer side LS1 and the side of the second longer side LS2. Accordingly, in the fourth semiconductor region SR1 between the first longer side LS1 and the second longer side LS2, a high potential area extending in the Y direction is formed, and a much steeper gradient of the potential decreasing from the area right below the fourth semiconductor region SR1 toward the first longer side LS1 and the second longer side LS2 is formed.

In the distance sensor P10 according to this embodiment, since inclination of the potential is formed from the area right below the fourth semiconductor region SR1 toward the first longer side LS1 and the second longer side LS2, the transfer speed can be improved.

Since the fourth semiconductor region SR1 that is a potential adjusting means is shared by the area right below the portion of the photo gate electrode PG1 on the side of the first longer side LSI and the area right below the portion of the photo gate electrode PG1 on the side of the second longer side LS2, the use efficiency of the area is improved. Accordingly, the aperture ratio can be improved.

Since the charge transfer signals $S_1$ and $S_2$ having mutually-differing phases are input to the plurality of first-side transfer electrodes ($TX1_1$ and $TX2_1$), and the charge transfer signals $S_1$ and $S_2$ having the mutually-differing phases are also input to the plurality of second-side transfer electrodes ($TX1_2$ and $TX2_2$), a failure in collection of the signal charge decreases, and the influence of manufacturing variations in the X direction is reduced. Accordingly, the transfer precision can be improved.

Since the distance sensor P10 includes the third semiconductor regions $FD3_1$ and $FD3_2$ and the third gate electrodes $TX3_1$ and $TX3_2$ on the side of the first longer side LS1 and the side of the second longer side LS2, respectively, unnecessary electric charge can be discharged. Accordingly, the transfer precision can be improved.

Since the light receiving area includes the first area and the second area, and the potential adjusting means is the fourth semiconductor region SR1 having high impurity concentration arranged between the first area and the second area, high potential can be generated using a simple configuration.

Figure 23:
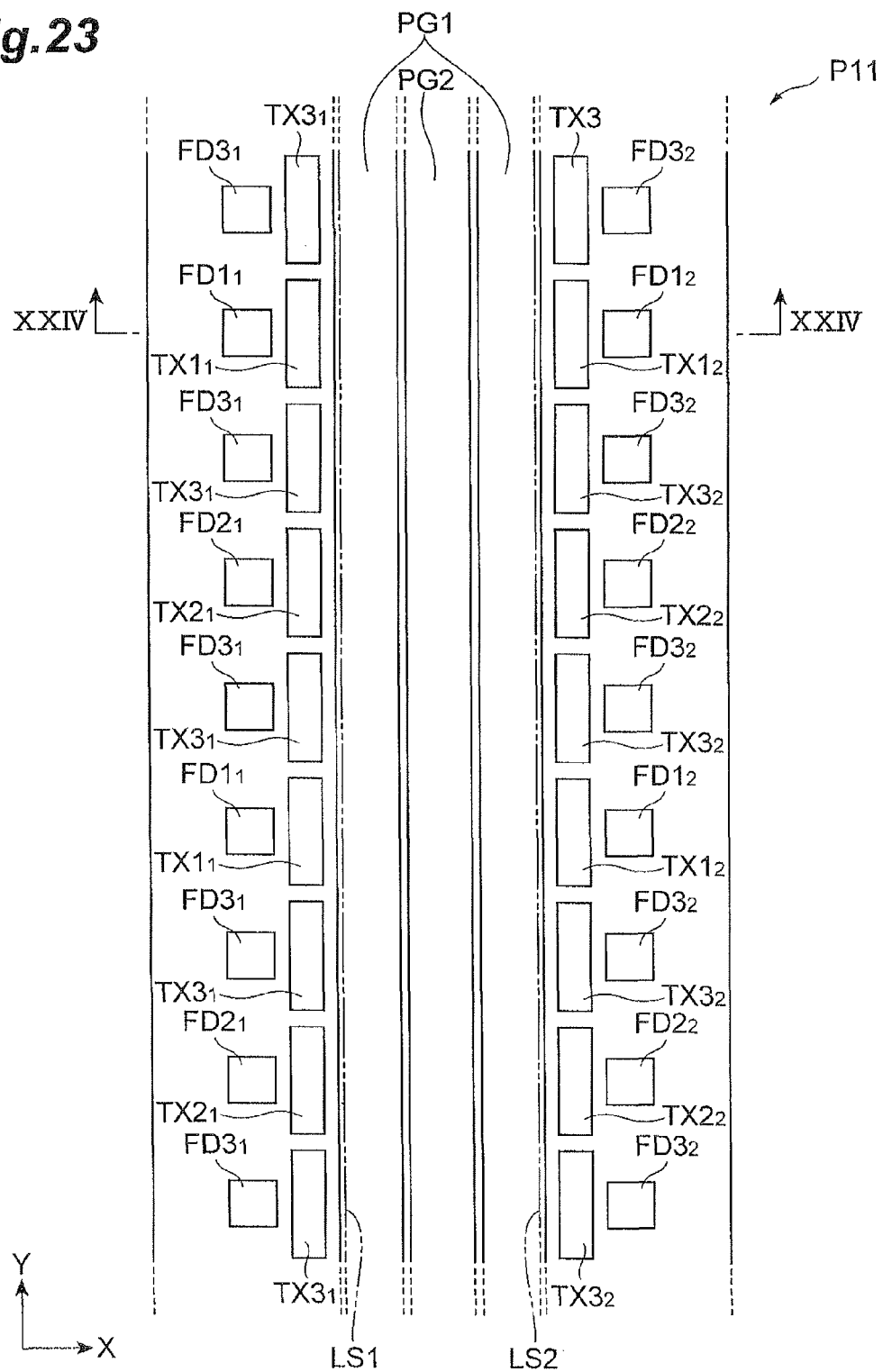
FIG. 23 is a plan view that illustrates a part of a distance sensor according to further another embodiment.
Figure 24:
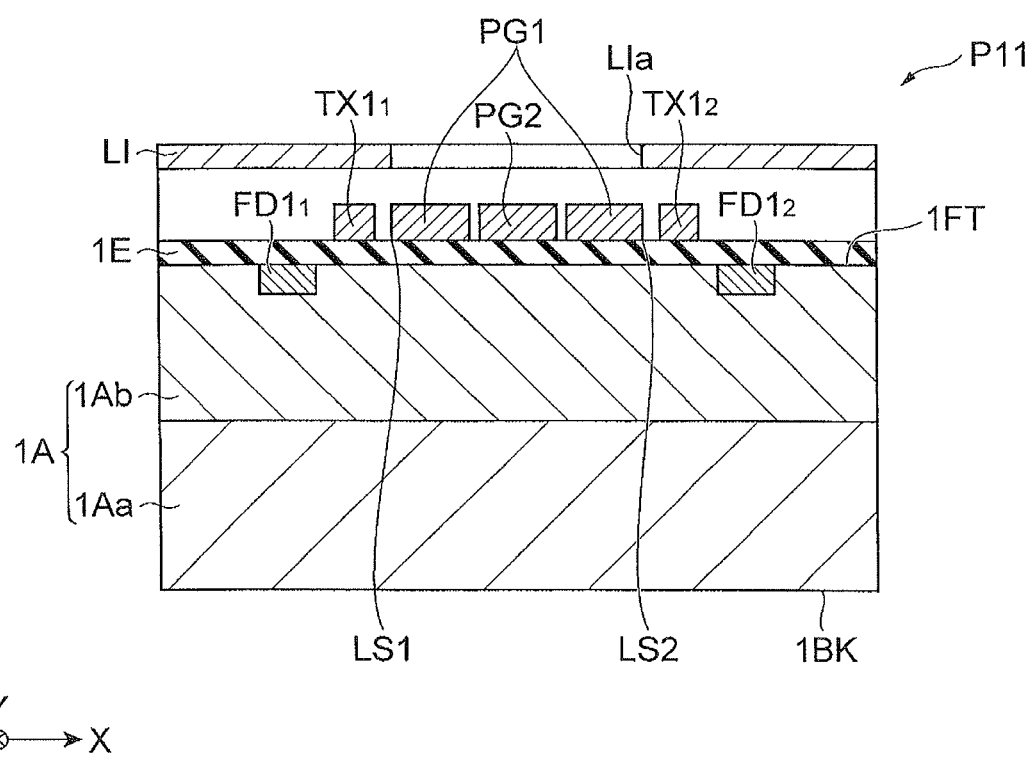
FIG. 24 is a cross-sectional view taken along line XXIV-XXIV illustrated in FIG. 23.

Subsequently, the configuration of a distance sensor according to further another embodiment will be described. FIG. 23 is a plan view that illustrates a part of the distance sensor according to further another embodiment. FIG. 24 is a cross-sectional view taken along line XXIV-XXIV illustrated in FIG. 23.

As illustrated in FIGS. 23 and 24, a distance sensor P11 according to this embodiment differs in the configuration of a potential adjusting means, compared to the above-described distance sensor P1 (see FIG. 4). More specifically, the distance sensor P11 is different from the distance sensor P1 in that the configuration of the photo gate electrode PG1 is different, a potential adjusting electrode PG2 is further included, and the fourth semiconductor region SR1 is not disposed.

In the distance sensor P10, the photo gate electrode PG1 is divided into two parts in the X direction. Each part of the divided photo gate electrode PG1 shows a rectangular shape having the Y direction as its longer-side direction. The part of the divided photo gate electrode PG1 on the side of the first longer side LS1 serves as a first electrode part. The part of the divided photo gate electrode PG1 on the side of the second longer side LS2 serves as a second electrode part.

The potential adjusting electrode PG2 is disposed on the light incident surface 1FT through the insulating layer 1E. The potential adjusting electrode PG2 is arranged between the first electrode part and the second electrode part of the photo gate electrode PG1 to be separate therefrom. In other words, the potential adjusting electrode PG2 is electrically separated from the first electrode part and the second electrode part of the photo gate electrode PG1. The potential adjusting electrode PG2 shows a rectangular shape having the Y direction as its longer-side direction in the plan view. The potential adjusting electrode PG2 may be formed using polysilicon or any other material.

Electric potential lower than that applied to the photo gate electrode PG1 is applied to the potential adjusting electrode PG2. Accordingly, the potential of the area disposed right below the potential adjusting electrode PG2 is higher than that of the side of the first longer side LS1 and the side of the second longer side LS2 (the potential of the areas right below the photo gate electrode PG1). Accordingly, in the area right below the potential adjusting electrode PG2 between the first longer side LS1 and the second longer side LS2, a high potential area extending in the Y direction is formed, and a much steeper gradient of the potential decreasing from the area right below the potential adjusting electrode PG2 toward the first longer side LS1 and the second longer side LS2 is formed.

In the distance sensor P10, the fifth semiconductor region SR2 is not disposed.

In the distance sensor P11 according to this embodiment, since inclination of the potential is formed from the area right below the potential adjusting electrode PG2 toward the first longer side LS1 and the second longer side LS2, the transfer speed can be improved.

Since the potential adjusting electrode PG2 that is a potential adjusting means is shared by the area right below the portion of the photo gate electrode PG1 on the side of the first longer side LS1 and the area right below the portion of the photo gate electrode PG1 on the side of the second longer side LS2, the use efficiency of the area is improved. Accordingly, the aperture ratio can be improved.

Since the charge transfer signals $S_1$ and $S_2$ having mutually-differing phases are input to the plurality of first-side transfer electrodes ($TX1_1$ and $TX2_1$), and the charge transfer signals $S_1$ and $S_2$ having the mutually-differing phases are also input to the plurality of second-side transfer electrodes ($TX1_2$ and $TX2_2$), a failure in collection of the signal charge decreases, and the influence of manufacturing variations in the X direction is reduced. Accordingly, the transfer precision can be improved.

Since the distance sensor P11 includes the third semiconductor regions $FD3_1$ and $FD3_2$ and the third gate electrodes $TX3_1$ and $TX3_2$ on the side of the first longer side LS1 and the side of the second longer side LS2, respectively, unnecessary electric charge can be discharged. Accordingly, the transfer precision can be improved.

The photo gate electrode PG1 includes the first electrode part arranged on the side area of the first longer side LS1 of the light receiving area and the second electrode part that is separate from the first electrode part in the X direction in which the first longer side LS1 and the second longer side LS2 face each other and is arranged on the side area of the second longer side of the light receiving area. The potential adjusting means is the potential adjusting electrode PG2 arranged between the first electrode part and the second electrode part to be electrically separated from the first and second electrode parts and is supplied with electric potential lower than electric potential applied to the photo gate electrode. For this reason, by adjusting the electric potential applied to the photo gate electrode PG1 and the potential adjusting electrode PG2, the degree of inclination of the potential can be appropriately adjusted.

As above, while the preferred embodiments of the present invention have been described, the present invention is not necessarily limited to the embodiments described above, and various changes may be made therein in a range not departing from the concept thereof.

The distance image sensor 1 is not limited to the front-illuminated-type distance image sensor. The distance image sensor 1 may be a back-illuminated-type distance image sensor.

In addition, the electric charge generation region in which electric charge is generated according to incident light may be configured by a photodiode (for example, a pinned photodiode). The distance image sensor 1 is not limited to a distance image senor in which the distance sensors P1 to 10 are arranged in a one-dimensional pattern but may be a distance image sensor in which the distance sensors P1 to 10 are arranged in a two-dimensional pattern.

In the distance image sensor 1 according to this embodiment, the conductivity types of the p type and the n type may be interchanged to be types opposite to those described above.

INDUSTRIAL APPLICABILITY

The present invention, for example, can be used for a distance sensor, a distance image sensor, and the like that are built into a product monitor in a manufacturing line of a factory, a vehicle, or the like.

REFERENCE SIGNS LIST

1 Distance image sensor
$FD1_1$ to $FD3_2$ First to Third semiconductor regions
LS1 First longer side of light receiving area
LS2 Second longer side of light receiving area
P1 to P10 Distance sensor PG1 Photo gate electrode
PG2 Potential adjusting electrode
SR1 Fourth Semiconductor region
SR3 Sixth Semiconductor region
TX1$_1$ to TX6$_2$ First to Sixth gate electrodes

The invention claimed is:

1. A distance sensor comprising:
a light receiving area including a first side and a second side facing each other, a length of the first and second sides being longer than a gap between the first side and the second side;
a photo gate electrode arranged along the first side and the second side on the light receiving area;
a plurality of first-side signal charge collection regions arranged on a side of the first side of the light receiving area to be separate from each other along the first side and collecting signal charge generated according to incident light;
a plurality of second-side signal charge collection regions arranged on a side of the second side of the light receiving area to be separate from each other along the second side, each of the plurality of second-side signal charge collection regions being arranged to face the corresponding first-side signal charge collection region across the light receiving area, and collecting the signal charge;
a plurality of first-side transfer electrodes provided with charge transfer signals having mutually-differing phases, and arranged between the corresponding first-side signal charge collection regions and the photo gate electrode;
a plurality of second-side transfer electrodes provided with the charge transfer signals having mutually-differing phases, and arranged between the corresponding second-side signal charge collection regions and the photo gate electrode; and
a potential adjusting means positioned between the first side and the second side and raising potential of an area extending in a direction in which the first and second sides extend to be higher than potential of a side area of the first side and a side area of the second side such that inclination of the potential is formed from the area toward the side area of the first side and the side area of the second side.

2. The distance sensor according to claim 1, wherein the plurality of first-side transfer electrodes and the plurality of second-side transfer electrodes are arranged such that the first-side transfer electrode and the second-side transfer electrode, provided with the charge transfer signals having the same phase, face each other in a direction in which the first side and the second side face each other.

3. The distance sensor according to claim 1, wherein the plurality of first-side transfer electrodes and the plurality of second-side transfer electrodes are arranged such that the first-side transfer electrode and the second-side transfer electrode, provided with the charge transfer signals having mutually-differing phases, face each other in a direction in which the first side and the second side face each other.

4. The distance sensor according to claim 1, wherein the plurality of first-side transfer electrodes and the plurality of second-side transfer electrodes are arranged at positions deviating from each other in the direction in which the first and second sides extend.

5. The distance sensor according to claim 1,
wherein the plurality of first-side transfer electrodes include a pair of the first-side transfer electrodes provided with the charge transfer signals having mutually-differing phases, and adjacent to each other in the direction in which the first and second sides extend,
wherein the plurality of second-side transfer electrodes include a pair of the second-side transfer electrodes provided with the charge transfer signals having mutually-differing phases, and adjacent to each other in the direction in which the first and second sides extend, and
wherein each of the first-side transfer electrodes of the pair and each of the second-side transfer electrodes of the pair include a first portion extending in the direction in which the first and second sides extend and a second portion extending to overlap the light receiving area from an end portion of the first portion positioned farther from the adjacent first portion.

6. The distance sensor according to claim 1, further comprising:
first-side unnecessary electric charge discharging regions arranged on the side of the first side of the light receiving area to be separate from each other along the first side and separate from the first-side signal charge collection regions, and discharging generated unnecessary electric charge;
second-side unnecessary electric charge discharging regions arranged on the side of the second side of the light receiving area to be separate from each other along the second side and separate from the second-side signal charge collection regions, and discharging generated unnecessary electric charge;
first-side unnecessary electric charge discharging gate electrodes arranged between the first-side unnecessary electric charge discharging regions and the photo gate electrode, and selectively performing blocking and releasing of a flow of unnecessary electric charge to the first-side unnecessary electric charge discharging regions; and
second-side unnecessary electric charge discharging gate electrodes arranged between the second-side unnecessary electric charge discharging regions and the photo gate electrode, and selectively performing blocking and releasing of a flow of unnecessary electric charge to the second-side unnecessary electric charge discharging regions.

7. The distance sensor according to claim 6, wherein each of the first-side unnecessary electric charge discharging gate electrodes and the second-side unnecessary electric charge discharging gate electrodes includes a third portion extending in the direction in which the first and second sides extend, and a fourth portion extending from the third portion to overlap the light receiving area.

8. The distance sensor according to claim 1,
wherein the light receiving area includes a first area including the first side and extending in a direction in which the first side extends, and a second area including the second side and extending in a direction in which the second side extends, and
wherein the potential adjusting means is a semiconductor region arranged to be positioned between the first area and the second area, has the same conductivity type as a conductivity type of the first and second areas, and has higher impurity concentration than those of the first and second areas.

9. The distance sensor according to claim 1,
wherein the photo gate electrode includes a first electrode part arranged on a side area of the first side of the light receiving area, and a second electrode part separate from the first electrode part in a direction in which the first side and the second side face each other and arranged on a side area of the second side of the light receiving area, and wherein the potential adjusting means is an electrode arranged between the first electrode part and the second electrode part to be electrically separated from the first and second electrode parts, and is supplied with electric potential lower than electric potential applied to the photo gate electrode.

10. A distance image sensor including an imaging area configured by a plurality of units arranged in a one-dimensional pattern or a two-dimensional pattern on a semiconductor substrate, and acquiring a distance image based on amounts of electric charges output from the units, each of the units being the distance sensor according to claim 1.

* * * * *